(12) United States Patent
Dubrow et al.

(10) Patent No.: US 9,909,062 B2
(45) Date of Patent: Mar. 6, 2018

(54) LIGHT-EMITTING DIODE (LED) DEVICES COMPRISING NANOCRYSTALS

(71) Applicant: Nanosys, Inc., Milpitas, CA (US)

(72) Inventors: Robert S. Dubrow, San Carlos, CA (US); Jian Chen, Sunnyvale, CA (US); Veeral D. Hardev, Redwood City, CA (US); Hans Jurgen Hofler, Sunnyvale, CA (US); Ernest Lee, Palo Alto, CA (US)

(73) Assignee: Nanosys, Inc., Milpitas, CA (US)

( * ) Notice: Subject to any disclaimer, the term of this patent is extended or adjusted under 35 U.S.C. 154(b) by 462 days.

(21) Appl. No.: 14/626,764

(22) Filed: Feb. 19, 2015

(65) Prior Publication Data

US 2015/0259597 A1    Sep. 17, 2015

Related U.S. Application Data

(60) Division of application No. 12/609,736, filed on Oct. 30, 2009, now abandoned, which is a
(Continued)

(51) Int. Cl.
*C09K 11/88* (2006.01)
*C09K 11/02* (2006.01)
(Continued)

(52) U.S. Cl.
CPC .......... *C09K 11/883* (2013.01); *C09K 11/025* (2013.01); *C09K 11/565* (2013.01); *G02B 1/02* (2013.01); *G02B 1/10* (2013.01); *G02B 6/0041* (2013.01); *G02B 6/0068* (2013.01); *H01L 33/502* (2013.01); *H01L 33/505* (2013.01); *H01L 33/507* (2013.01); *H05B 33/04* (2013.01); *B32B 2457/206* (2013.01); *B82Y 20/00* (2013.01); *H01L 2924/0002* (2013.01);
(Continued)

(58) Field of Classification Search
None
See application file for complete search history.

(56) References Cited

U.S. PATENT DOCUMENTS 5,667,650 A    9/1997 Face et al.
5,881,200 A    3/1999 Burt
(Continued)

FOREIGN PATENT DOCUMENTS

CN    1886844 A    12/2006
CN    1894799 A    1/2007
(Continued)

OTHER PUBLICATIONS

Definition of "powder," Merriam-Webster Dictionary, www.merriam-webster.com/dictionary/powder.
(Continued)

*Primary Examiner* — Nathan T Leong
(74) *Attorney, Agent, or Firm* — Sterne, Kessler, Goldstein & Fox P.L.L.C.

(57) ABSTRACT

The present invention provides light-emitting diode (LED) devices comprises compositions and containers of hermetically sealed luminescent nanocrystals. The present invention also provides displays comprising the LED devices. Suitably, the LED devices are white light LED devices.

32 Claims, 17 Drawing Sheets

Related U.S. Application Data continuation-in-part of application No. 12/076,530, filed on Mar. 19, 2008, now abandoned.

(60) Provisional application No. 60/895,656, filed on Mar. 19, 2007, provisional application No. 60/985,014, filed on Nov. 2, 2007.

(51) Int. Cl.

| C09K 11/56 | (2006.01) |
| --- | --- |
| F21V 8/00 | (2006.01) |
| H01L 33/50 | (2010.01) |
| H05B 33/04 | (2006.01) |
| G02B 1/02 | (2006.01) |
| G02B 1/10 | (2015.01) |
| B82Y 20/00 | (2011.01) |

(52) U.S. Cl.
CPC ..... *H01L 2933/0041* (2013.01); *Y02B 20/181* (2013.01); *Y10S 977/81* (2013.01); *Y10S 977/834* (2013.01); *Y10S 977/952* (2013.01); *Y10T 156/10* (2015.01)

(56) References Cited

U.S. PATENT DOCUMENTS

| 5,990,479 | A | 11/1999 | Weiss et al. |
| --- | --- | --- | --- |
| 6,107,105 | A | 8/2000 | Sandhu |
| 6,541,790 | B1 | 4/2003 | Pichler |
| 6,570,325 | B2 | 5/2003 | Graff et al. |
| 6,744,960 | B2 | 6/2004 | Pelka |
| 6,755,563 | B2 | 6/2004 | Wahlig et al. |
| 6,780,704 | B1 | 8/2004 | Raaijmakers et al. |
| 6,878,871 | B2 | 4/2005 | Scher et al. |
| 6,933,537 | B2 | 8/2005 | Yee et al. |
| 6,949,206 | B2 | 9/2005 | Whiteford et al. |
| 7,009,213 | B2 | 3/2006 | Camras et al. |
| 7,122,842 | B2 | 10/2006 | Hill |
| 7,180,566 | B2 | 2/2007 | Lee |
| 7,255,823 | B1 | 8/2007 | Guenther et al. |
| 7,267,875 | B2 | 9/2007 | Whiteford et al. |
| 7,347,807 | B2 | 3/2008 | Prust et al. |
| 7,453,705 | B2 | 11/2008 | Tolt |
| 7,585,564 | B2 | 9/2009 | Whiteford et al. |
| 7,845,825 | B2 | 12/2010 | Ramer et al. |
| 8,088,483 | B1 | 1/2012 | Whiteford et al. |
| 8,143,703 | B2 | 3/2012 | Heald et al. |
| 8,343,575 | B2 | 1/2013 | Dubrow |
| 8,441,101 | B2 | 5/2013 | Wang |
| 2001/0008363 | A1 | 7/2001 | Sanghera et al. |
| 2002/0018632 | A1 | 2/2002 | Pelka |
| 2003/0111955 | A1 | 6/2003 | McNulty et al. |
| 2003/0148379 | A1 | 8/2003 | Roitman et al. |
| 2003/0223218 | A1 | 12/2003 | Kawakami |
| 2004/0036130 | A1 | 2/2004 | Lee et al. |
| 2004/0042233 | A1 | 3/2004 | Suzuki et al. |
| 2004/0233664 | A1 | 11/2004 | Beeson et al. |
| 2004/0245912 | A1 | 12/2004 | Thurk et al. |
| 2005/0051766 | A1 | 3/2005 | Stokes et al. |
| 2005/0111805 | A1 | 5/2005 | Hertz et al. |
| 2005/0164589 | A1 | 7/2005 | Ghosh |
| 2005/0200269 | A1 | 9/2005 | Ng et al. |
| 2005/0214067 | A1 | 9/2005 | Scher et al. |
| 2005/0215164 | A1 | 9/2005 | Mueller et al. |
| 2006/0001036 | A1 | 1/2006 | Jacob et al. |
| 2006/0068154 | A1 | 3/2006 | Parce et al. |
| 2006/0208657 | A1 | 9/2006 | Hara et al. |
| 2006/0238103 | A1 | 10/2006 | Choi et al. |
| 2006/0244358 | A1 | 11/2006 | Kim et al. |
| 2006/0258253 | A1 | 11/2006 | Lynn |
| 2006/0291226 | A1 | 12/2006 | Daicho et al. |
| 2007/0001182 | A1 | 1/2007 | Schardt et al. |
| 2007/0012941 | A1 | 1/2007 | Cheon |
| 2007/0031674 | A1 | 2/2007 | Tolt |
| 2007/0034833 | A1* | 2/2007 | Parce ..... B82Y 20/00 252/301.36 |
| 2007/0040501 | A1 | 2/2007 | Aitken et al. |
| 2007/0077594 | A1 | 4/2007 | Hikmet et al. |
| 2007/0170418 | A1 | 7/2007 | Bowers |
| 2007/0178615 | A1 | 8/2007 | Banin et al. |
| 2007/0252526 | A1 | 11/2007 | Aitken et al. |
| 2007/0267972 | A1 | 11/2007 | Menegus et al. |
| 2007/0273274 | A1 | 11/2007 | Horiuchi et al. |
| 2008/0012001 | A1 | 1/2008 | Gillies |
| 2008/0012031 | A1 | 1/2008 | Jang et al. |
| 2008/0173886 | A1 | 7/2008 | Cheon et al. |
| 2008/0191604 | A1 | 8/2008 | Morris et al. |
| 2008/0237540 | A1 | 10/2008 | Dubrow |
| 2009/0162011 | A1 | 6/2009 | Coe-Sullivan et al. |
| 2009/0296368 | A1 | 12/2009 | Ramer |
| 2010/0110728 | A1 | 5/2010 | Dubrow et al. |
| 2010/0155749 | A1 | 6/2010 | Chen et al. |
| 2012/0068118 | A1 | 3/2012 | Parce et al. |
| 2013/0181603 | A1 | 7/2013 | Dubrow et al. |
| 2013/0196460 | A1 | 8/2013 | Dubrow et al. |
| 2014/0009964 | A1 | 1/2014 | Dubrow et al. |
| 2014/0017396 | A1 | 1/2014 | Whiteford et al. |
| 2014/0035011 | A1 | 2/2014 | Chen et al. |

FOREIGN PATENT DOCUMENTS

| EP | 1 965 453 A2 | 9/2008 |
| --- | --- | --- |
| EP | 2121872 B1 | 9/2015 |
| JP | 2001-200363 | 7/2001 |
| JP | 2005-197476 A | 7/2005 |
| JP | 2005-260229 A | 9/2005 |
| JP | 2005-270644 A | 10/2005 |
| JP | 2005-538573 A | 12/2005 |
| JP | 2006-0-37097 A | 2/2006 |
| JP | 2006-114909 A | 4/2006 |
| JP | 2006-313902 A | 11/2006 |
| JP | 2006-321966 A | 11/2006 |
| JP | 2007-273498 A | 10/2007 |
| WO | WO 2004/105201 A2 | 12/2004 |
| WO | WO 2005/022120 A2 | 3/2005 |
| WO | WO 2005/055330 A1 | 6/2005 |
| WO | WO 2005/067524 | 7/2005 |
| WO | WO 2006/017125 A3 | 2/2006 |
| WO | WO 2006/129366 A1 | 12/2006 |

OTHER PUBLICATIONS

Co-pending U.S. Appl. No. 10/796,832, inventors Scher et al., filed Mar. 10, 2004 (Not Published).
Canadian Office Action directed to related Canadian Patent Application No. 2,678,798, dated Feb. 26, 2014; 3 pages.
First Chinese Office Action (with English language translation) directed to related Chinese Patent Application No. 200880008604.3, dated Jun. 5, 2012; 11 pages.
Second Chinese Office Action (with English language translation) directed to related Chinese Patent Application No. 200880008604.3, dated Jan. 30, 2013; 12 pages.
European Search Report directed to related European Patent Application No. 08742127.7, dated Oct. 18, 2011; 8 pages.
European Search Report directed to related European Patent Application No. 08742127.7, dated Sep. 10, 2012; 4 pages.
Notice of Reasons for Refusal (with English language translation) directed to related Japanese Patent Application No. 2013-181580, dated Sep. 2, 2014; 4 pages.
Notice of Grounds for Rejection (with English language translation) directed to related Korean Patent Application No. 2009-7021697, dated May 23, 2014; 6 pages.
International Search Report directed to related International Patent Application No. PCT/US2008/003549, dated Jun. 12, 2008; 1 page.
International Preliminary Report on Patentability and Written Opinion of the International Searching Authority directed to related International Patent Application No. PCT/US2008/003549, dated Sep. 22, 2009; 7 pages.
International Search Report directed to related International Patent Application No. PCT/US2010/054259, dated Mar. 4, 2011; 4 pages.

(56) References Cited

OTHER PUBLICATIONS

International Preliminary Report on Patentability and Written Opinion of the International Searching Authority directed to related International Patent Application No. PCT/US2010/054259, dated May 1, 2012; 13 pages.
English-Language Abstract for Chinese Patent Publication No. CN 1894799 A, published Jan. 10, 2007; 2 pages.
English-Language Abstract for Japanese Patent Publication No. JP 2006-37097 A, published Feb. 9, 2006; 2 pages.
English-Language Abstract for Japanese Patent Publication No. JP 2005-538573 A, published Dec. 15, 2005; 1 page.
Notification of Reasons for Refusal (with machine English language translation) directed to related Japanese Patent Application No. 2009-554552, dated Jun. 27, 2013; 7 pages.
Decision to Grant (with machine English language translation) directed to related Japanese Patent Application No. 2013-181580, dated May 28, 2015; 6 pages.
Search Report by Registered Searching Organization (with machine English language translation) directed to related Japanese Patent Application No. 2013-181580, dated Jul. 7, 2014; 16 pages.
Takeda, Y et al. "A Novel Method Based on Oblique Depositions to Fabricate Quantum Dot Arrays" IEEE 4th World Conf (2006) 1:75-78.
Alivisatos, A.P., "Semiconductor clusters, nanocrystals, and quantum dots" Science (1996) 271:933-937.
Murray, C.B. et al., "Synthesis and Characterization of Nearly Monodisperse CdE (E+S, Se, Te) Semiconductor Nanocrystallites" J. Am, Chem. Soc. (1993) 115:8706-8715.
Peng, X. et al., "Epitaxial growth of highly luminescent CdSc/CdS core/shell nanocrystals with photostability and electronic accessibility" J. Am. Chem. Soc. (1997) 119:7019-7029.
Canadian Office Action directed to related Canadian Patent Application No. 2,678,798, dated Nov. 9, 2015; 3 pages.

\* cited by examiner

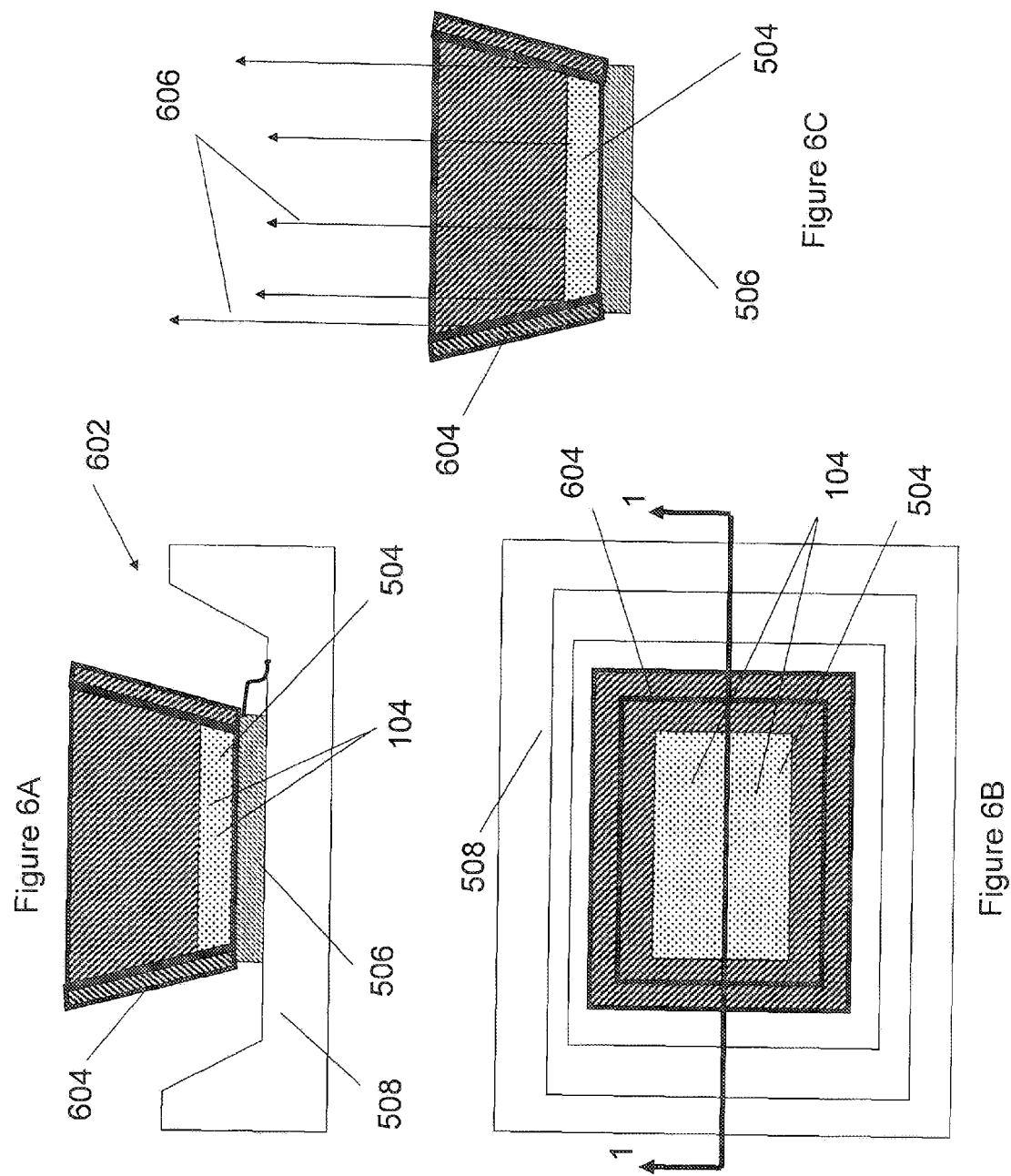

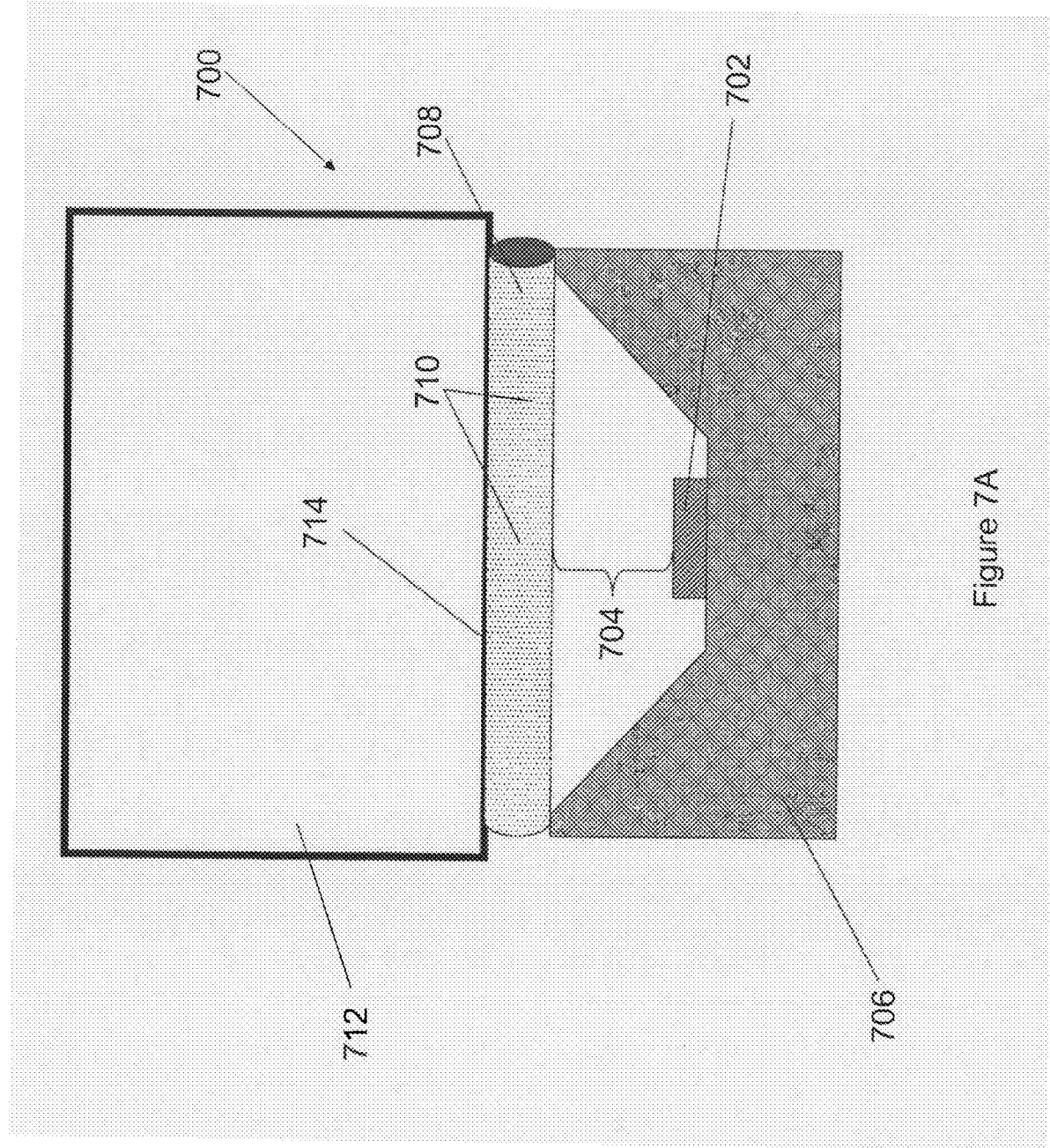

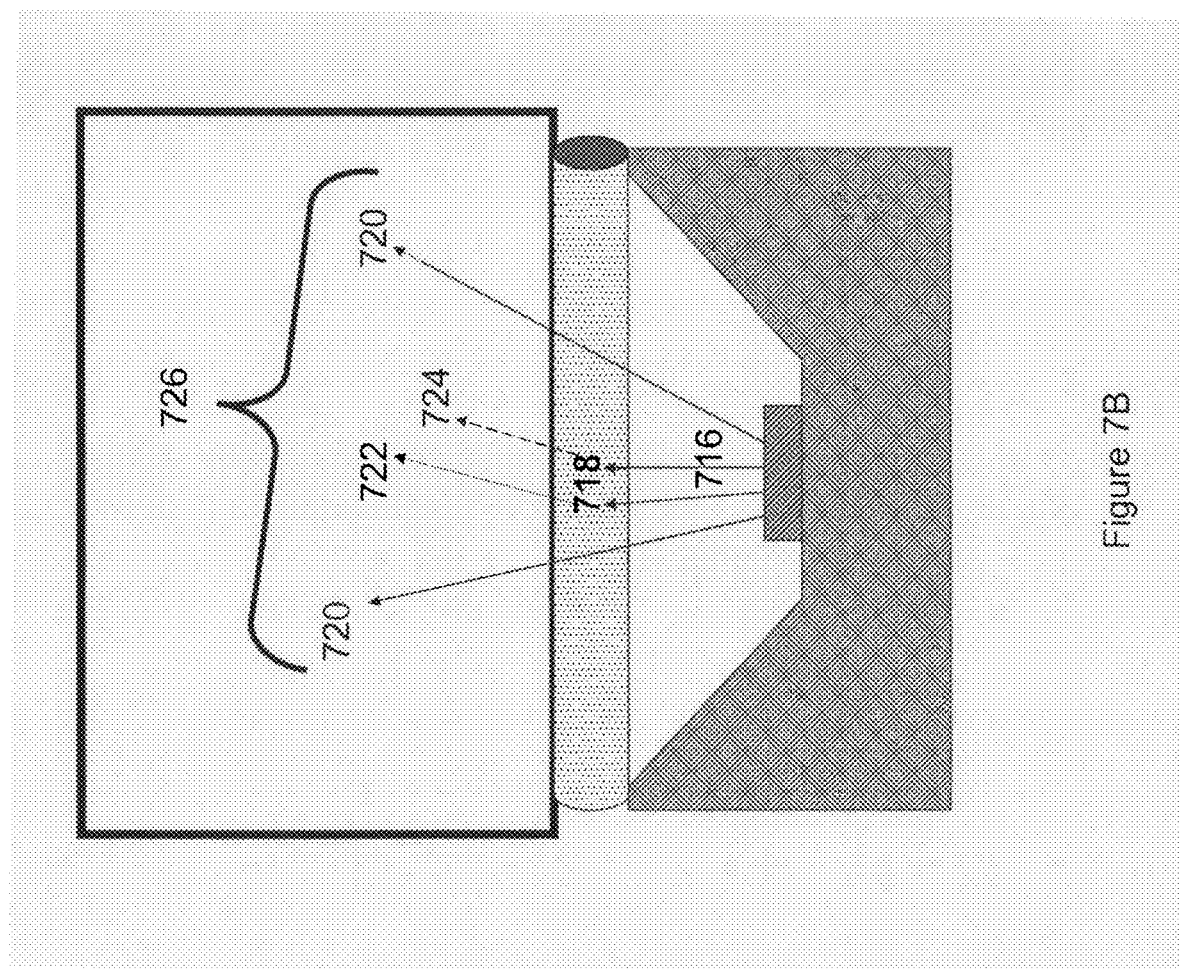

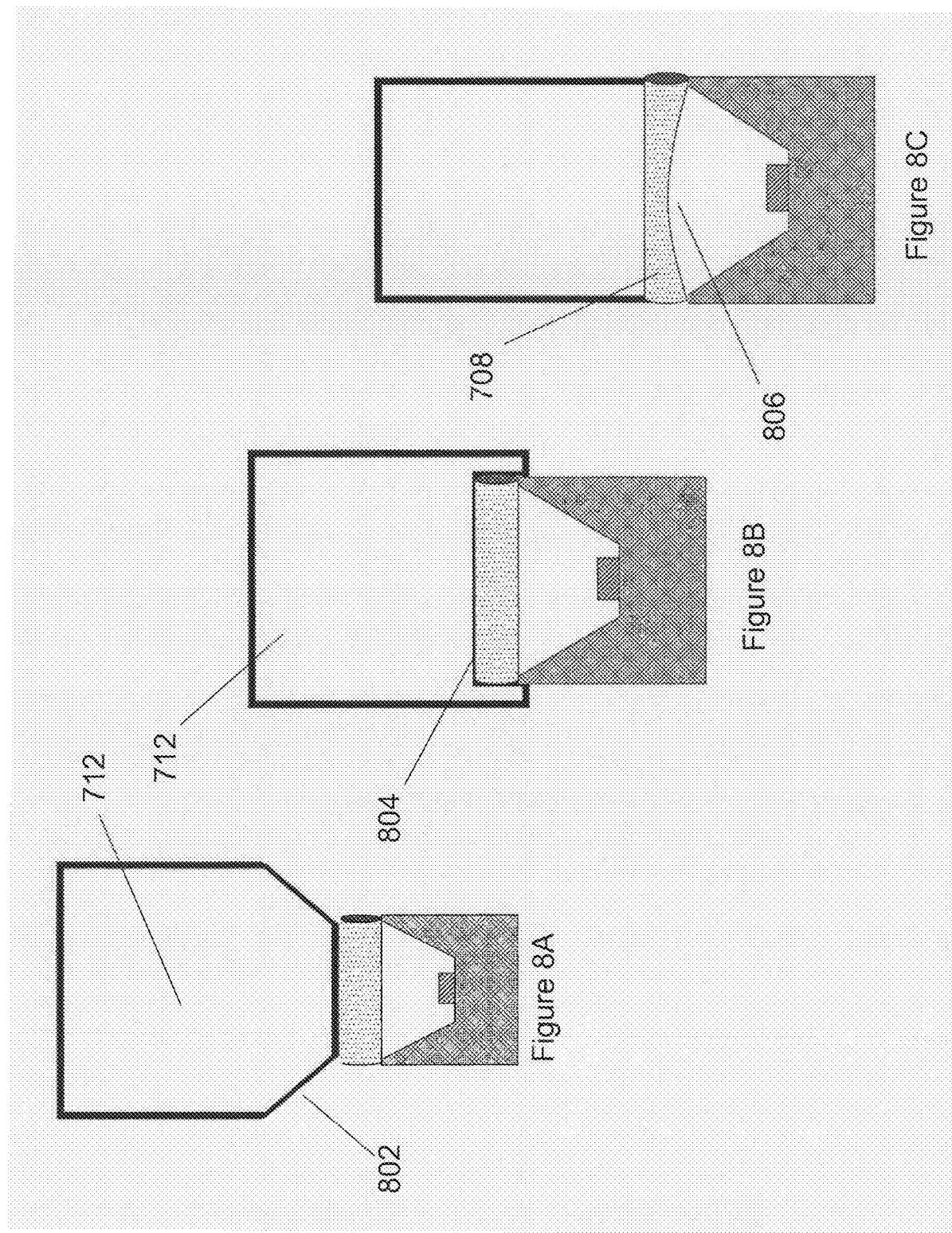

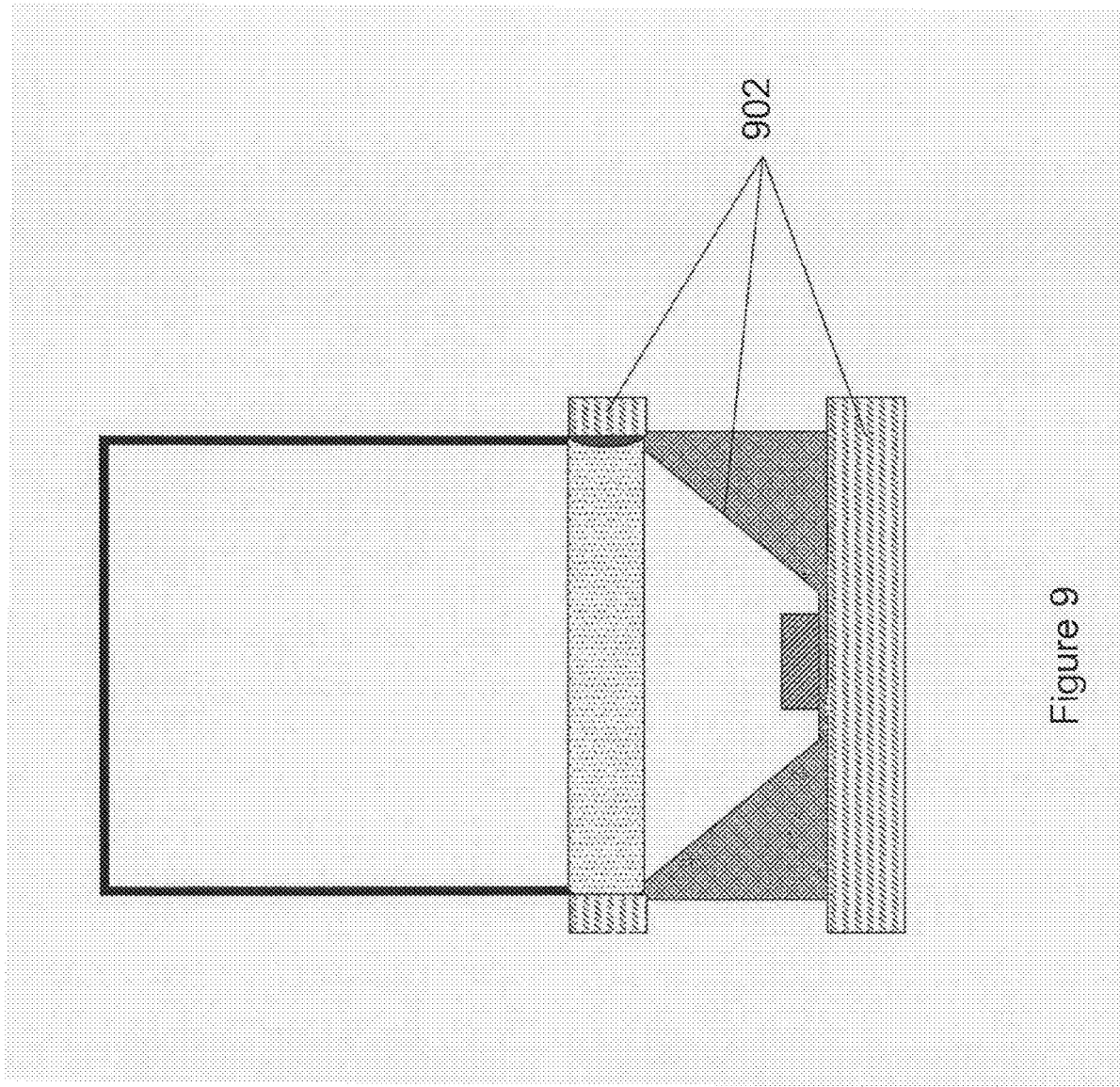

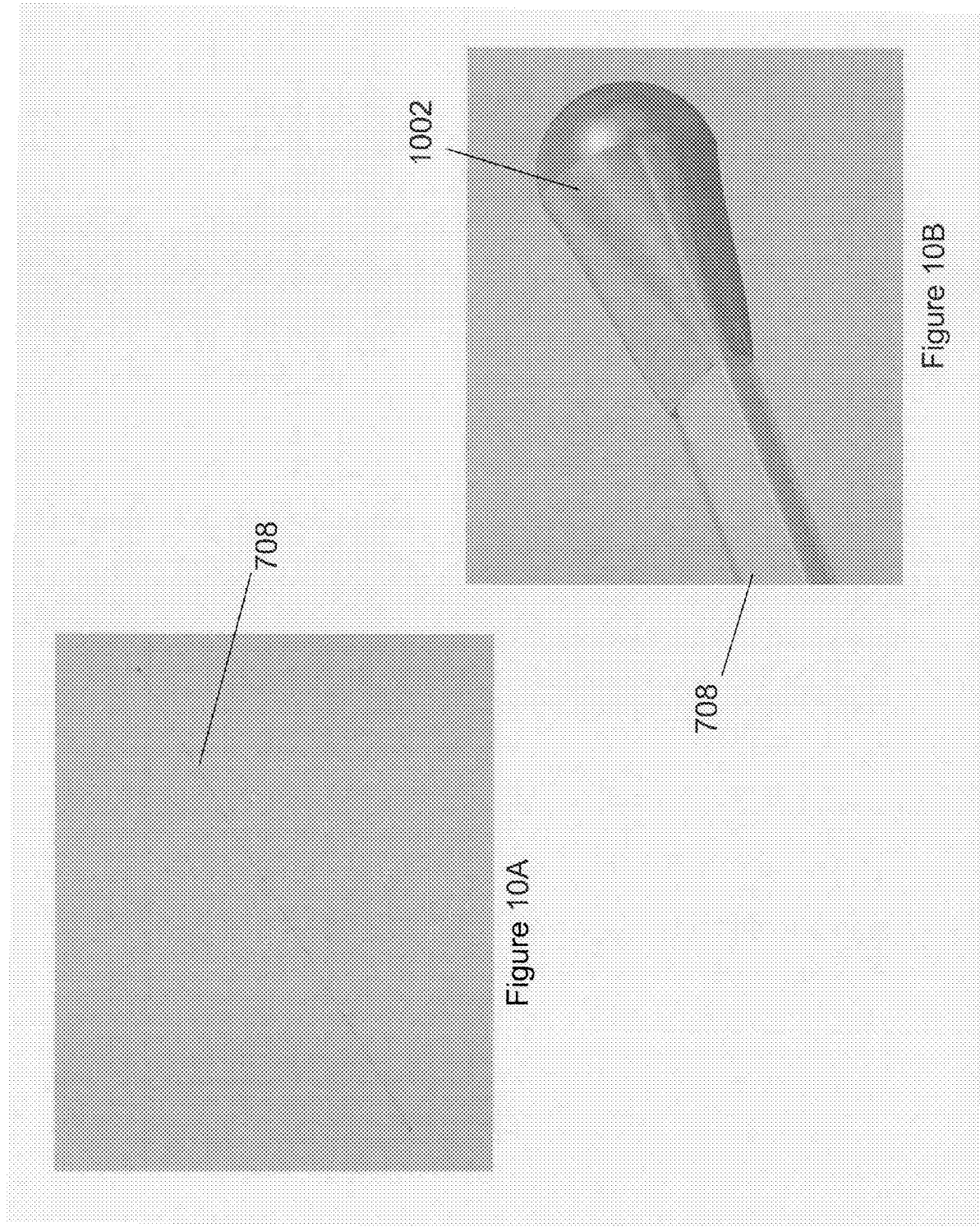

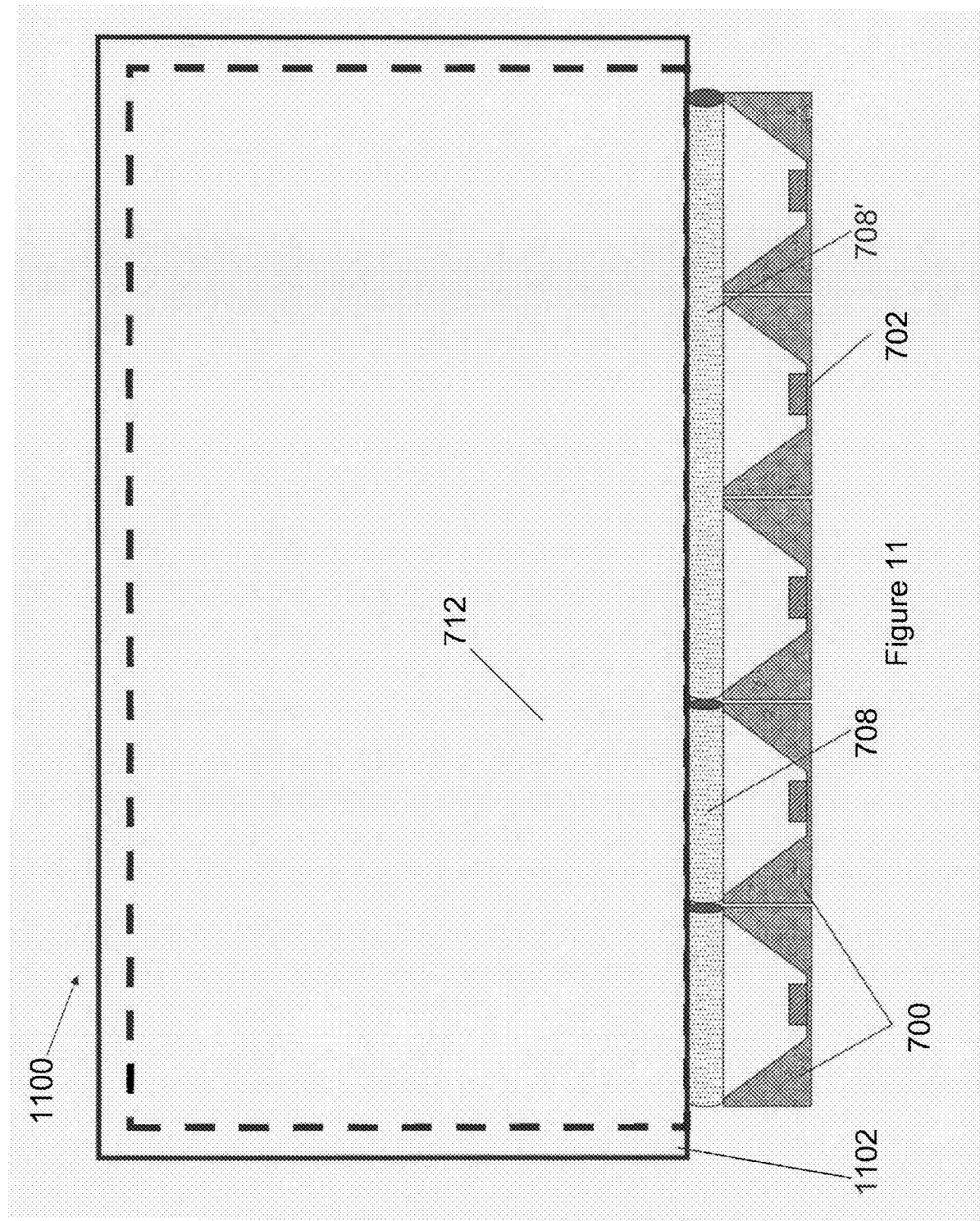

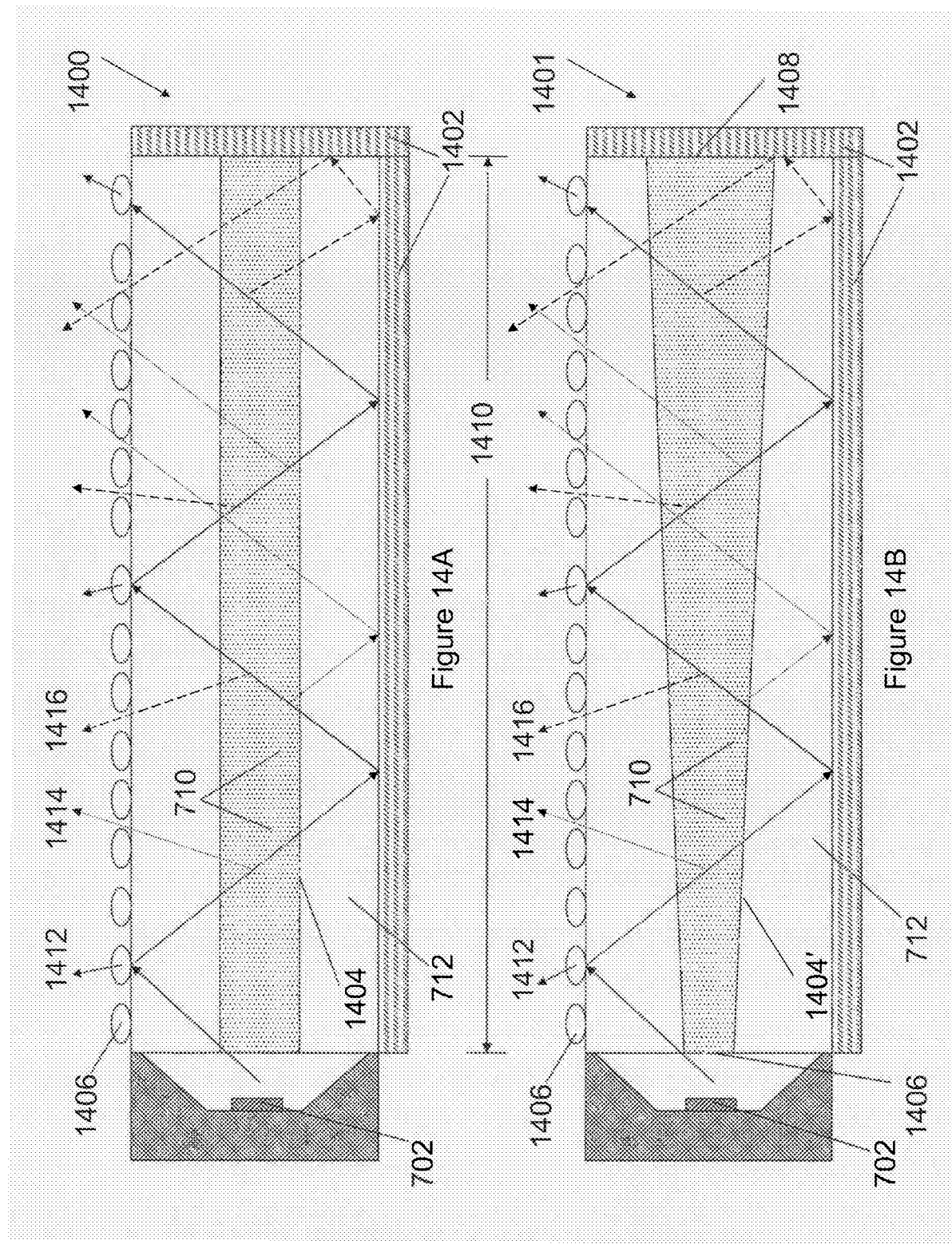

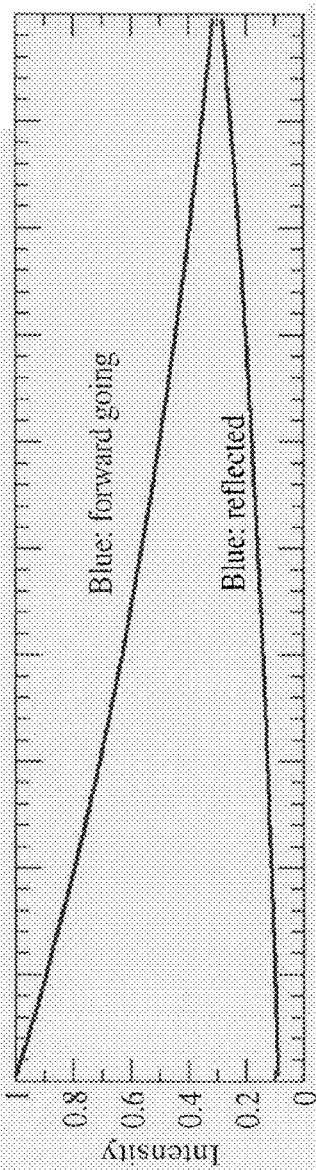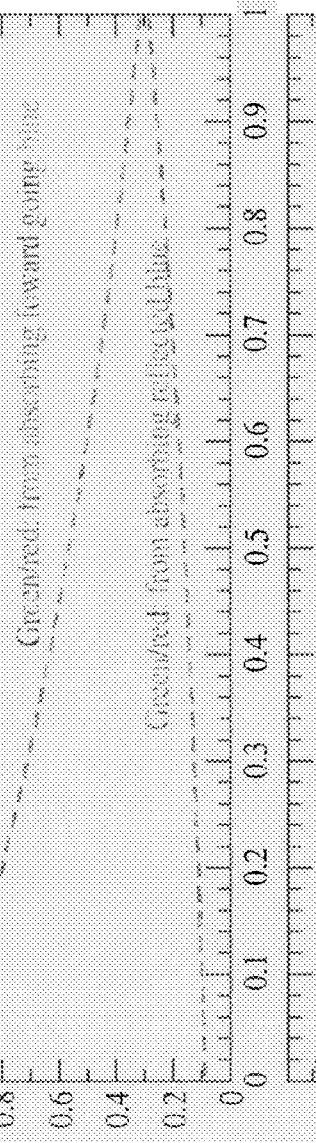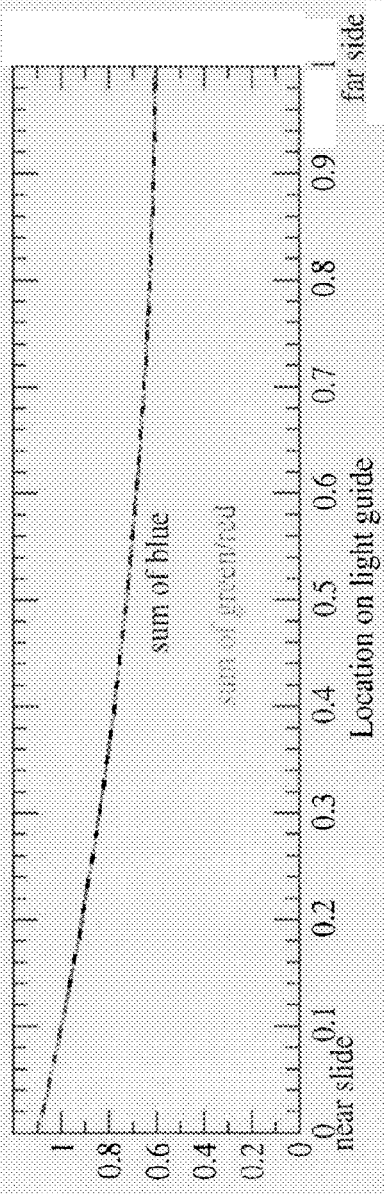
Figure 15A
Figure 15B
Figure 15C

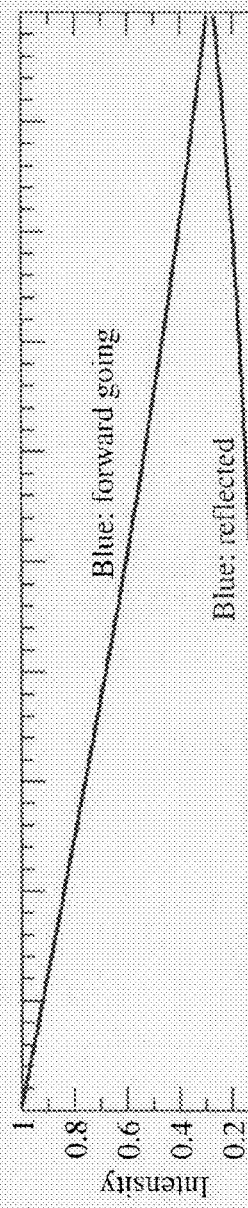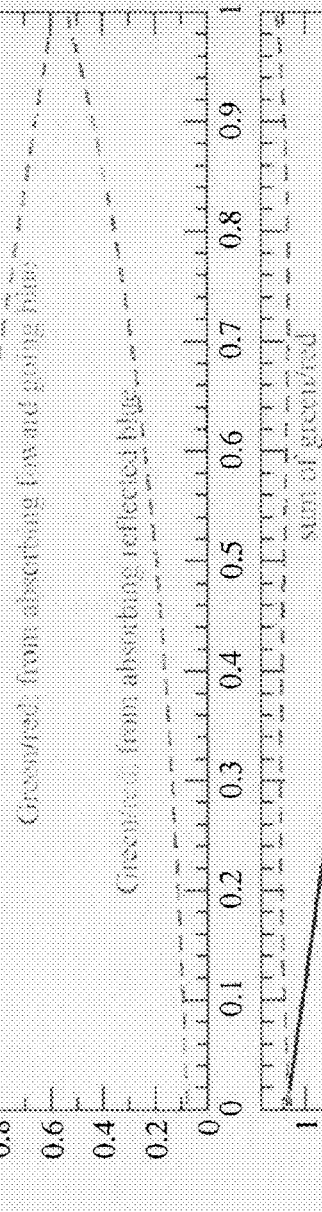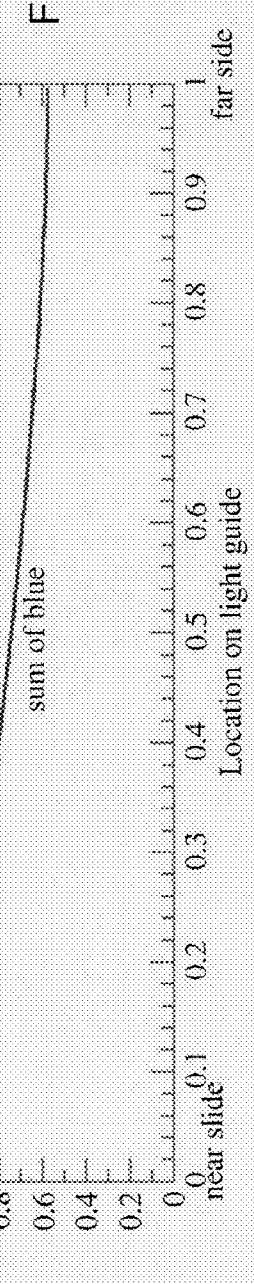

LIGHT-EMITTING DIODE (LED) DEVICES COMPRISING NANOCRYSTALS

RELATED APPLICATIONS

The present application is related to U.S. patent application Ser. No. 12/609,736, U.S. patent application Ser. No. 12/076,530, U.S. Provisional Patent Application No. 60/895,656, and U.S. Provisional Patent Application No. 60/985,014, which are all hereby incorporated by reference in their entireties.

BACKGROUND OF THE INVENTION

Field of the Invention

The present invention relates to methods light-emitting diode (LED) devices comprising luminescent nanocrystals, suitably white light LEDs. The present invention also relates to display systems comprising the LED devices.

Background of the Invention

Luminescent nanocrystals when exposed to air and moisture undergo oxidative damage, often resulting in a loss of luminescence. The use of luminescent nanocrystals in applications such as down-conversion and filtering layers often expose luminescent nanocrystals to elevated temperatures, high intensity light, environmental gasses and moisture. These factors, along with requirements for long luminescent lifetime in these applications, often limits the use of luminescent nanocrystals or requires frequent replacement. There exists a need therefore for methods and compositions to hermetically seal luminescent nanocrystals, thereby allowing for increased usage lifetime and luminescent intensity.

There also exists a need for light-emitting diode (LED) devices utilizing hermetically sealed nanocrystals, including white light LED devices.

BRIEF SUMMARY OF THE INVENTION

In one embodiment, the present invention provides light-emitting diode (LED) devices. The LED devices suitably comprise a blue-light emitting LED and a hermetically sealed container comprising a plurality of luminescent nanocrystals. The container is placed with respect to the LED to facilitate down-conversion of the luminescent nanocrystals.

Suitable hermetically sealed containers include plastic or glass tubes, such as glass capillaries. In exemplary embodiments, hermetically sealed container is spaced apart from the LED. Suitably, the luminescent nanocrystals emit green light and red light. Exemplary the luminescent nanocrystals for use in the LED devices comprise CdSe or ZnS, including luminescent nanocrystals that are core/shell luminescent nanocrystals comprising CdSe/ZnS, InP/ZnS, PbSe/PbS, CdSe/CdS, CdTe/CdS or CdTe/ZnS. In exemplary embodiments, the luminescent nanocrystals are dispersed in a polymeric matrix. The present invention also provides display systems comprising the LED devices.

In further embodiments, the present invention provides light-emitting diode (LED) devices comprising an LED, a hermetically sealed container comprising a plurality of luminescent nanocrystals optically coupled to the LED and a light guide optically coupled to the hermetically sealed container. Suitably, a first portion of light emitted from the LED is down-converted by the luminescent nanocrystals, and a second portion of light emitted from the LED, and the down-converted light from the luminescent nanocrystals, are emitted from the light guide.

In exemplary embodiments, the LED emits blue light. Suitably, the first portion of blue light emitted from the LED is down-converted by the luminescent nanocrystals to green light and red light. The second portion of blue light, the green light and the red light suitably combine to produce white light.

Exemplary hermetically sealed containers include plastic or glass containers, such as glass capillaries having least one dimension of about 100 µm to about 1 mm. Suitably, the luminescent nanocrystals comprise CdSe or ZnS, and can be core/shell nanocrystals comprising CdSe/ZnS, InP/ZnS, PbSe/PbS, CdSe/CdS, CdTe/CdS or CdTe/ZnS. The luminescent nanocrystals can be dispersed in a polymeric matrix. In suitable embodiments, the hermetically sealed container is spaced apart from the LED. In embodiments, the LED devices of the present invention are white light LED devices.

The present invention also provides display systems comprising a display and a plurality of the LED devices described herein. Suitably, the display at least partially encloses the light guide. A first portion of light emitted from the LED is down-converted by the luminescent nanocrystals, and a second portion of light emitted from the LED and the down-converted light from the luminescent nanocrystals are emitted from the light guide and displayed on the display. In exemplary embodiments, the hermetically sealed container is optically coupled to at least two LEDs.

In a still further embodiment, the present invention provides composite materials. The composite materials comprise a first polymeric material having a first composition. The composites also comprise a second polymeric material having a second composition, and a plurality of luminescent nanocrystals dispersed in the second polymeric material. The second polymeric material is dispersed in the first polymeric material.

Suitably, the first polymeric material comprises an epoxy or a polycarbonate, and the second polymeric material comprises aminosilicone. In embodiments, the luminescent nanocrystals emit green light and/or red light. Suitably, the luminescent nanocrystals comprise CdSe or ZnS, or can be core/shell luminescent nanocrystals comprising CdSe/ZnS, InP/ZnS, PbSe/PbS, CdSe/CdS, CdTe/CdS or CdTe/ZnS. In further embodiments, the composites comprising an inorganic layer of $SiO_2$, $TiO_2$ or $AlO_2$, hermetically sealing the composite. Suitably, the composites have an optical density of about 0.5 to about 0.9 (e.g., about 0.8) at the blue LED wavelength and a path length of about 50 µm to about 200 µm (e.g., about 100 µm).

The present invention also provides methods of preparing luminescent nanocrystal composite materials. The methods suitably comprise dispersing a plurality of luminescent nanocrystals in a first polymeric material to form a mixture of the luminescent nanocrystals and the first polymeric material. The mixture is cured, and a particulate is generated from the cured mixture. The particulate is dispersed in a second polymeric material to generate the composite material. Suitably, a cross-linker is added to the mixture prior to the curing. In exemplary embodiments, the particulate is generated by ball milling the cured mixture. The composites can be formed into a film.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 6A-6C show a hermetically sealed composition further comprising a light-focusing apparatus in accordance with one embodiment of the present invention.

FIG. 7A shows an LED device in accordance with one embodiment of the present invention.

FIG. 7B shows the down-conversion of light from an LED device of the present invention.

FIGS. 8A-8C show variations of LED devices of the present invention.

FIG. 9 shows an LED device of the present invention comprising reflectors.

FIGS. 10A-10B show hermetically sealed capillaries in accordance with embodiments of the present invention.

FIG. 11 shows a display device in accordance with an embodiment of the present invention.

FIGS. 14A and 14B show an LED device comprising a light guide with a region of nanocrystals in accordance with various embodiments of the present invention.

FIGS. 15A-15C show light intensity output for an LED device comprising a light guide with a region of nanocrystals.

FIGS. 16A-16C show light intensity output for an LED device comprising a light guide with a region of nanocrystals of increasing thickness.

The present invention will now be described with reference to the accompanying drawings. In the drawings, like reference numbers indicate identical or functionally similar elements.

DETAILED DESCRIPTION OF THE INVENTION

Figure 1:
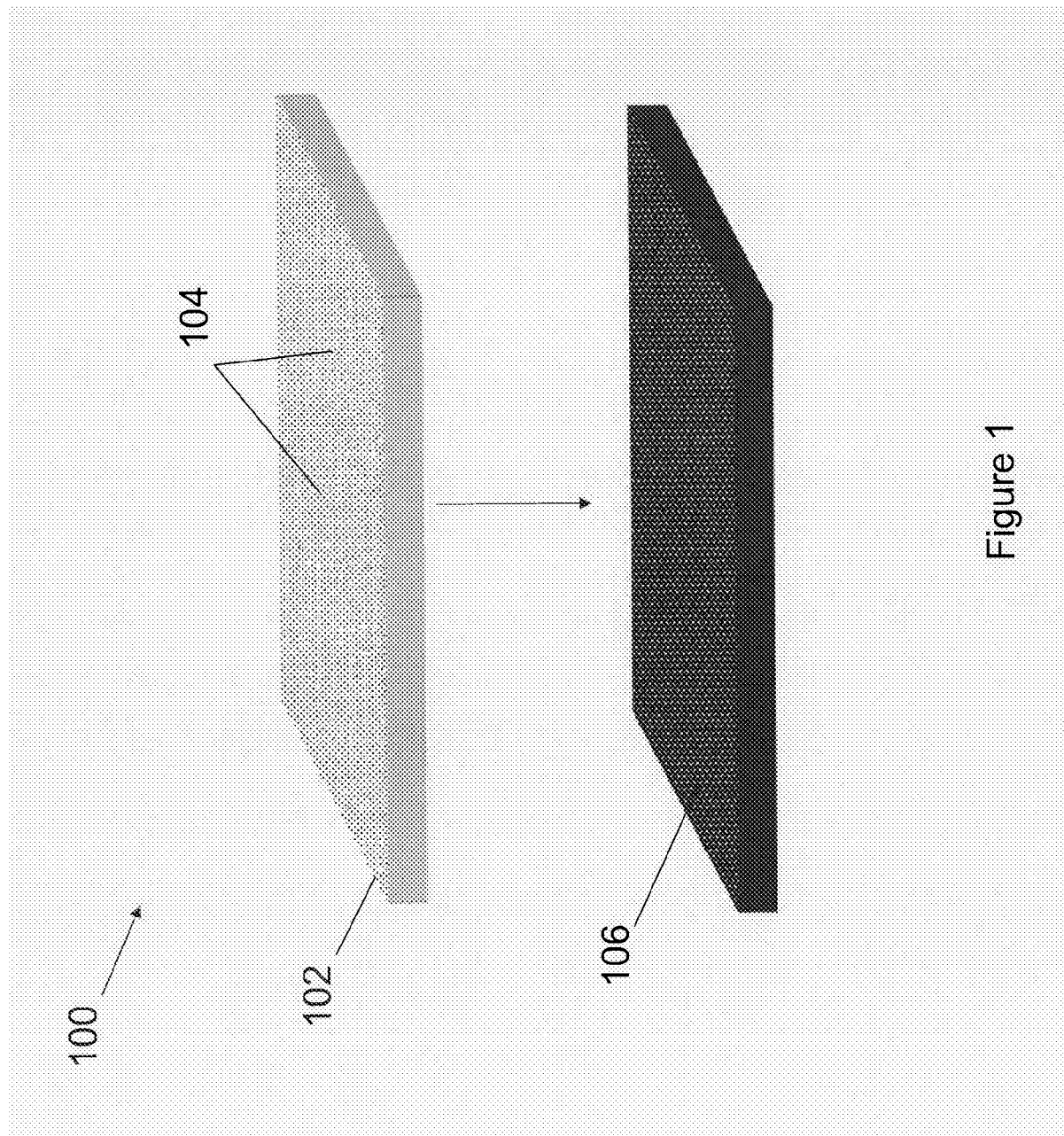
FIG. 1 shows a hermetically sealed luminescent nanocrystal composition in accordance with one embodiment of the present invention.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanocrystal, nanowire (NW), nanorod, nanotube, and nanoribbon technologies and other functional aspects of the systems (and components of the individual operating components of the systems) may not be described in detail herein.

The present invention provides various compositions comprising nanocrystals, including luminescent nanocrystals. The various properties of the luminescent nanocrystals, including their absorption properties, emission properties and refractive index properties, can be tailored and adjusted for various applications. As used herein, the term "nanocrystal" refers to nanostructures that are substantially monocrystalline. A nanocrystal has at least one region or characteristic dimension with a dimension of less than about 500 nm, and down to on the order of less than about 1 nm. As used herein, when referring to any numerical value, "about" means a value of ±10% of the stated value (e.g. "about 100 nm" encompasses a range of sizes from 90 nm to 110 nm, inclusive). The terms "nanocrystal," "nanodot," "dot" and "quantum dot" are readily understood by the ordinarily skilled artisan to represent like structures and are used herein interchangeably. The present invention also encompasses the use of polycrystalline or amorphous nanocrystals. As used herein, the term "nanocrystal" also encompasses "luminescent nanocrystals." As used herein, the term "luminescent nanocrystals" means nanocrystals that emit light when excited by an external energy source (suitably light). As used herein when describing the hermetic sealing of nanocrystals, it should be understood that in suitable embodiments, the nanocrystals are luminescent nanocrystals.

Typically, the region of characteristic dimension will be along the smallest axis of the structure. Nanocrystals can be substantially homogenous in material properties, or in certain embodiments, can be heterogeneous. The optical properties of nanocrystals can be determined by their particle size, chemical or surface composition. The ability to tailor the luminescent nanocrystal size in the range between about 1 nm and about 15 nm enables photoemission coverage in the entire optical spectrum to offer great versatility in color rendering. Particle encapsulation offers robustness against chemical and UV deteriorating agents.

Nanocrystals, including luminescent nanocrystals, for use in the present invention can be produced using any method known to those skilled in the art. Suitable methods and exemplary nanocrystals are disclosed in U.S. patent application Ser. No. 11/034,216, filed Jan. 13, 2005; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties. The nanocrystals for use in the present invention can be produced from any suitable material, including an inorganic material, and more suitably an inorganic conductive or semiconductive material. Suitable semiconductor materials include those disclosed in U.S. patent application Ser. No. 10/796,832, and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2(S, Se, Te)_3$, $Al_2CO$, and an appropriate combination of two or more such semiconductors.

In certain aspects, the semiconductor nanocrystals may comprise a dopant from the group consisting of: a p-type dopant or an n-type dopant. The nanocrystals useful in the present invention can also comprise II-VI or III-V semiconductors. Examples of II-VI or III-V semiconductor nanocrystals include any combination of an element from Group II, such as Zn, Cd and Hg, with any element from Group VI, such as S, Se, Te, Po, of the Periodic Table; and any combination of an element from Group III, such as B, Al, Ga, In, and Tl, with any element from Group V, such as N, P, As, Sb and Bi, of the Periodic Table.

The nanocrystals, including luminescent nanocrystals, useful in the present invention can also further comprise ligands conjugated, cooperated, associated or attached to their surface as described throughout. Suitable ligands include any group known to those skilled in the art, including those disclosed in U.S. patent application Ser. No. 11/034,216, U.S. patent application Ser. No. 10/656,910 and U.S. Provisional Patent Application No. 60/578,236, the disclosures of each of which are incorporated herein by reference. Use of such ligands can enhance the ability of the nanocrystals to incorporate into various solvents and matrixes, including polymers. Increasing the miscibility (i.e., the ability to be mixed without separation) of the nanocrystals in various solvents and matrixes allows them to be distributed throughout a polymeric composition such that the nanocrystals do not aggregate together and therefore do not scatter light. Such ligands are described as "miscibility-enhancing" ligands herein.

As used herein, the term nanocomposite refers to matrix materials comprising nanocrystals distributed or embedded therein. Suitable matrix materials can be any material known to the ordinarily skilled artisan, including polymeric materials, organic and inorganic oxides. Nanocomposites of the present invention can be layers, encapsulants, coatings or films as described herein. It should be understood that in embodiments of the present invention where reference is made to a layer, polymeric layer, matrix, or nanocomposite, these terms are used interchangeably, and the embodiment so described is not limited to any one type of nanocomposite, but encompasses any matrix material or layer described herein or known in the art.

Down-converting nanocomposites (for example, as disclosed in U.S. patent application Ser. No. 11/034,216) utilize the emission properties of luminescent nanocrystals that are tailored to absorb light of a particular wavelength and then emit at a second wavelength, thereby providing enhanced performance and efficiency of active sources (e.g., LEDs). As discussed above, use of luminescent nanocrystals in such down-conversion applications, as well as other filtering or coating applications, often exposes the nanocrystals to elevated temperatures, high intensity light (e.g., an LED source), external gasses, and moisture. Exposure to these conditions can reduce the efficiency of the nanocrystals, thereby reducing useful product lifetime. In order to overcome this problem, the present invention provides methods for hermetically sealing luminescent nanocrystals, as well as hermetically sealed containers and compositions comprising luminescent nanocrystals.

Luminescent Nanocrystal Phosphors

While any method known to the ordinarily skilled artisan can be used to create nanocrystal phosphors, suitably, a solution-phase colloidal method for controlled growth of inorganic nanomaterial phosphors is used. See Alivisatos, A. P., "Semiconductor clusters, nanocrystals, and quantum dots," *Science* 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," *J. Am. Chem. Soc.* 115:8706 (1993), the disclosures of which are incorporated by reference herein in their entireties. This manufacturing process technology leverages low cost processability without the need for clean rooms and expensive manufacturing equipment. In these methods, metal precursors that undergo pyrolysis at high temperature are rapidly injected into a hot solution of organic surfactant molecules. These precursors break apart at elevated temperatures and react to nucleate nanocrystals. After this initial nucleation phase, a growth phase begins by the addition of monomers to the growing crystal. The result is freestanding crystalline nanoparticles in solution that have an organic surfactant molecule coating their surface.

Utilizing this approach, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape. The ratio of surfactants to monomer, surfactants to each other, monomers to each other, and the individual concentrations of monomers strongly influence the kinetics of growth.

In suitable embodiments, CdSe is used as the nanocrystal material, in one example, for visible light down-conversion, due to the relative maturity of the synthesis of this material. Due to the use of a generic surface chemistry, it is also possible to substitute non-cadmium-containing nanocrystals.

Core/Shell Luminescent Nanocrystals

In semiconductor nanocrystals, photo-induced emission arises from the band edge states of the nanocrystal. The band-edge emission from luminescent nanocrystals competes with radiative and non-radiative decay channels originating from surface electronic states. X. Peng, et al., *J. Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states is to epitaxially grow an inorganic shell material on the surface of the nanocrystal. X. Peng, et al., *J. Am. Chem. Soc.* 30:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials.

Exemplary materials for preparing core-shell luminescent nanocrystals include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such materials. Exemplary core-shell luminescent nanocrystals for use in the practice of the present invention include, but are not limited to, (represented as Core/Shell), CdSe/ZnS, InP/ZnS, PbSe/PbS, CdSe/CdS, CdTe/CdS, CdTe/ZnS, as well as others.

Hermetically Sealed Luminescent Nanocrystal Compositions and Luminescent Nanocrystal-comprising Containers In one embodiment, the present invention provides methods of hermetically sealing a composition comprising a plurality of luminescent nanocrystals. The methods suitably comprise disposing a barrier layer on the composition to seal the luminescent nanocrystals. As discussed throughout, the terms "hermetic," "hermetic sealing," and "hermetically sealed" are used throughout to indicate that the composition, container and/or luminescent nanocrystals are prepared in such a way that the quantity of gases (e.g., air) or moisture that passes through or penetrates the container or composition, and/or that contacts the luminescent nanocrystals is reduced to a level where it does not substantially effect the performance of the nanocrystals (e.g., their luminescence). Therefore, a "hermetically sealed composition," for example one that comprises luminescent nanocrystals, is a composition that does not allow an amount of air (or other gas, liquid or moisture) to penetrate the composition and contact the luminescent nanocrystals such that the performance of the nanocrystals (e.g., the luminescence) is substantially effected or impacted (e.g., reduced).

As used throughout, a plurality of luminescent nanocrystals means more than one nanocrystal (i.e., 2, 3, 4, 5, 10, 100, 1,000, 1,000,000, etc., nanocrystals). The compositions will suitably comprise luminescent nanocrystals having the same composition, though in further embodiments, the plurality of luminescent nanocrystals can be various different compositions. For example, the luminescent nanocrystals can all emit at the same wavelength, or in further embodiments, the compositions can comprise luminescent nanocrystals that emit at different wavelengths.

As shown in FIG. 1, in one embodiment, the present invention provides a composition 100 comprising a plurality of luminescent nanocrystals 104. Any nanocrystal can be prepared in the compositions of the present invention, including those described throughout, and otherwise known in the art, for example, as disclosed in U.S. patent application Ser. No. 11/034,216.

In suitable embodiments, composition 100 comprises a plurality of luminescent nanocrystals 104 dispersed throughout a matrix 102. As used throughout, dispersed includes uniform (i.e., substantially homogeneous) as well as non-uniform (i.e., substantially heterogeneous) distribution/placement of nanocrystals. Suitable matrixes for use in the compositions of the present invention include polymers and organic and inorganic oxides. Suitable polymers for use in the matrixes of the present invention include any polymer known to the ordinarily skilled artisan that can be used for such a purpose. In suitable embodiments, the polymer will be substantially translucent or substantially transparent. Such polymers include, but are not limited to, poly(vinyl butyral):poly(vinyl acetate); epoxies; urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including but not limited to, methylmethacrylate, butylmethacrylate and laurylmethacrylate; styrene based polymers; and polymers that are crosslinked with difunctional monomers, such as divinylbenzene.

The luminescent nanocrystals used the present invention can be embedded in a polymeric (or other suitable material, e.g., waxes, oils) matrix using any suitable method, for example, mixing the nanocrystals in a polymer and casting a film, mixing the nanocrystals with monomers and polymerizing them together, mixing the nanocrystals in a sol-gel to form an oxide, or any other method known to those skilled in the art. As used herein, the term "embedded" is used to indicate that the luminescent nanocrystals are enclosed or encased within the polymer that makes up the majority component of the matrix. It should be noted that luminescent nanocrystals are suitably uniformly distributed throughout the matrix, though in further embodiments they can be distributed according to an application-specific uniformity distribution function.

The thickness of the composition of the present invention can be controlled by any method known in the art, such as spin coating and screen printing. The luminescent nanocrystal compositions of the present invention can be any desirable size, shape, configuration and thickness. For example, the compositions can be in the form of layers, as well as other shapes, for example, discs, spheres, cubes or blocks, tubular configurations and the like. While the various compositions of the present invention can be any thickness required or desired, suitably, the compositions are on the order of about 100 mm in thickness (i.e., in one dimension), and down to on the order of less than about 1 mm in thickness. In other embodiments, the polymeric layers of the present invention can be on the order of 10's to 100's of microns in thickness. The luminescent nanocrystals can be embedded in the various compositions/matrixes at any loading ratio that is appropriate for the desired function. Suitably, the luminescent nanocrystals will be loaded at a ratio of between about 0.001% and about 75% by volume depending upon the application, matrix and type of nanocrystals used. The appropriate loading ratios can readily be determined by the ordinarily skilled artisan and are described herein further with regard to specific applications. In exemplary embodiments the amount of nanocrystals loaded in a luminescent nanocrystal composition are on the order of about 10% by volume, to parts-per-million (ppm) levels.

Luminescent nanocrystals for use in the present invention will suitably be less than about 100 nm in size, and down to less than about 2 nm in size. In suitable embodiments, the luminescent nanocrystals of the present invention absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. The photon-filtering nanocomposites of the present invention can be constructed so as to absorb light that makes up any one or more of these colors. For example, the nanocomposites of the present invention can be constructed so as to absorb blue light, red light, or green light, combinations of such colors, or any colors in between. As used herein, blue light comprises light between about 435 nm and about 500 nm, green light comprises light between about 520 nm and 565 nm and red light comprises light between about 625 nm and about 740 nm in wavelength. The ordinarily skilled artisan will be able to construct nanocomposites that can filter any combination of these wavelengths, or wavelengths between these colors, and such nanocomposites are embodied by the present invention.

In other embodiments, the luminescent nanocrystals have a size and a composition such that they absorb photons that are in the ultraviolet, near-infrared, and/or infrared spectra. As used herein, the ultraviolet spectrum comprises light between about 100 nm to about 400 nm, the near-infrared spectrum comprises light between about 750 nm to about 100 µm in wavelength and the infrared spectrum comprises light between about 750 nm to about 300 µm in wavelength.

While luminescent nanocrystals of any suitable material can be used in the practice of the present invention, in certain embodiments, the nanocrystals can be ZnS, InAs or CdSe nanocrystals, or the nanocrystals can comprise various combinations to form a population of nanocrystals for use in the practice of the present invention. As discussed above, in further embodiments, the luminescent nanocrystals are core/shell nanocrystals, such as CdSe/ZnS, CdSe/CdS or InP/ZnS.

In order to hermetically seal the compositions of the present invention, a barrier layer is disposed on the composition. For example, as shown in FIG. 1, a barrier layer 106 is disposed on the matrix 102 comprising luminescent nanocrystals 104, thereby generating a hermetically sealed composition. The term "barrier layer" is used throughout to indicate a layer, coating, sealant or other material that is disposed on the matrix 102 so as to hermetically seal the composition. Examples of barrier layers include any material layer, coating or substance that can create an airtight seal on the composition. Suitable barrier layers include inorganic layers, suitably an inorganic oxide such as an oxide of Al, Ba, Ca, Mg, Ni, Si, Ti or Zr. Exemplary inorganic oxide layers, include $SiO_2$, $TiO_2$, $AlO_2$ and the like. As used throughout, the terms "dispose," and "disposing" include any suitably method of application of a barrier layer. For example, disposing includes layering, coating, spraying, sputtering, plasma enhanced chemical vapor deposition, atomic layer deposition, or other suitable method of applying a barrier layer to the compositions. In suitable embodiments, sputtering is used to dispose the barrier layer on the compositions. Sputtering comprises a physical vapor deposition process where high-energy ions are used to bombard elemental sources of material, which eject vapors of atoms that are then deposited in thin layers on a substrate. See for example, U.S. Pat. Nos. 6,541,790; 6,107,105; and 5,667,650, the disclosures of each of which are incorporated by reference herein in their entireties.

In further embodiments, disposing the barrier layer can be carried out using atomic layer deposition. In applications such as coatings of LEDs, luminescent nanocrystal compositions, such as nanocrystal-comprising polymeric layers, can often have complex geometries and features. For example, components of the LED such as bond wires and solder joints often are directly in contact with, or even contained within, the polymeric layer. In order to properly hermetically seal the nanocrystal composition, a virtually defect-free (i.e., pin hole-free) barrier layer is often required. In addition, application of the barrier layer should not degrade the polymer or the nanocrystals. Therefore, in suitable embodiments, atomic layer deposition is used to dispose the barrier layer.

Atomic layer deposition (ALD) can comprise disposition of an oxide layer (e.g., $TiO_2$, $SiO_2$, $AlO_2$, etc.) on the luminescent nanocrystal composition, or in further embodiments, deposition of a non-conductive layer, such as a nitride (e.g., silicon nitride) can be used. ALD deposits an atomic layer (i.e., only a few molecules thick) by alternately supplying a reaction gas and a purging gas. A thin coating having a high aspect ratio, uniformity in a depression, and good electrical and physical properties, can be formed. Barrier layers deposited by the ALD method suitably have a low impurity density and a thickness of less than 1000 nm, suitably less than about 500 nm, less than about 200 nm, less than about 50 nm, less than about 20 nm, or less than about 5 nm.

For example, in suitable embodiments, two reaction gases, A and B are used. When only the reaction gas, A, flows into a reaction chamber, atoms of the reaction gas A are chemically adsorbed on the luminescent nanocrystal composition. Then, any remaining reaction gas A is purged with an inert gas such as Ar or nitrogen. Then, reaction gas B flows in, wherein a chemical reaction between the reaction gases A and B occurs only on the surface of the luminescent nanocrystal composition on which the reaction gas A has been adsorbed, resulting in an atomic barrier layer on the composition.

In embodiments where a non-conductive layer, such as a nitride layer is disposed, suitably $SiH_2Cl_2$ and remote plasma enhanced $NH_3$ are used to dispose a silicon nitride layer. This can be performed at a low temperature and does not require the use of reactive oxygen species.

Use of ALD for disposition of a barrier layer on the luminescent nanocrystal composition generates a virtually pin-hole free barrier layer regardless of the morphology of the substrate. The thickness of the barrier layer can be increased by repeating the deposition steps, thereby increasing the thickness of the layer in atomic layer units according to the number of repetitions. In addition, the barrier layer can be further coated with additional layers (e.g., via sputtering, CVD or ALD) to protect or further enhance the barrier.

Suitably, the ALD methods utilized in the practice of the present invention are performed at a temperature of below about 500° C., suitably below about 400° C., below about 300° C., or below about 200° C.

Exemplary barrier materials include organic material designed to specifically reduce oxygen and moisture transmission. Examples include filled epoxies (such as alumina filled epoxies) as well as liquid crystalline polymers.

As discussed throughout, matrix 102 suitably comprises a polymeric substrate. Thus, the present invention comprises methods of hermetically sealing compositions comprising luminescent nanocrystals, suitably polymeric substrates comprising luminescent nanocrystals, by disposing a barrier layer on the composition using any of the various methods disclosed herein or otherwise known in the art.

The ability to use polymeric substrates as matrix 102 allows for the formation of various shapes and configurations of the compositions, simply by molding or otherwise manipulating the compositions into the desired shape/orientation. For example, a solution/suspension of luminescent nanocrystals can be prepared (e.g., luminescent nanocrystals in a polymeric matrix). This solution can then be placed into any desired mold to form a required shape, and then cured (e.g., cooled or heated depending upon the type of polymer) to form a solid or semi-solid structure. For example, a mold can be prepared in the shape of a cap or disc to place on or over an LED. This then allows for preparation of a composition that can be used as a down-converting layer, for example. Following preparation of the desired shape, a barrier layer is then disposed on the composition to hermetically seal the composition, thereby protecting the luminescent nanocrystals from oxidation.

In additional embodiments, a composition comprising luminescent nanocrystals (e.g., a polymeric composition) can be disposed directly on a desired substrate or article (for example an LED). The luminescent nanocrystal composition (e.g., a solution or suspension) can then be cured and then a barrier layer disposed on the composition, thereby hermetically sealing the composition directly on the desired substrate or article. Such embodiments therefore do not require the preparation of a separate composition, and instead allow for the preparation of the composition directly on the desired article/substrate (e.g., a light source or other end product).

Figure 3:
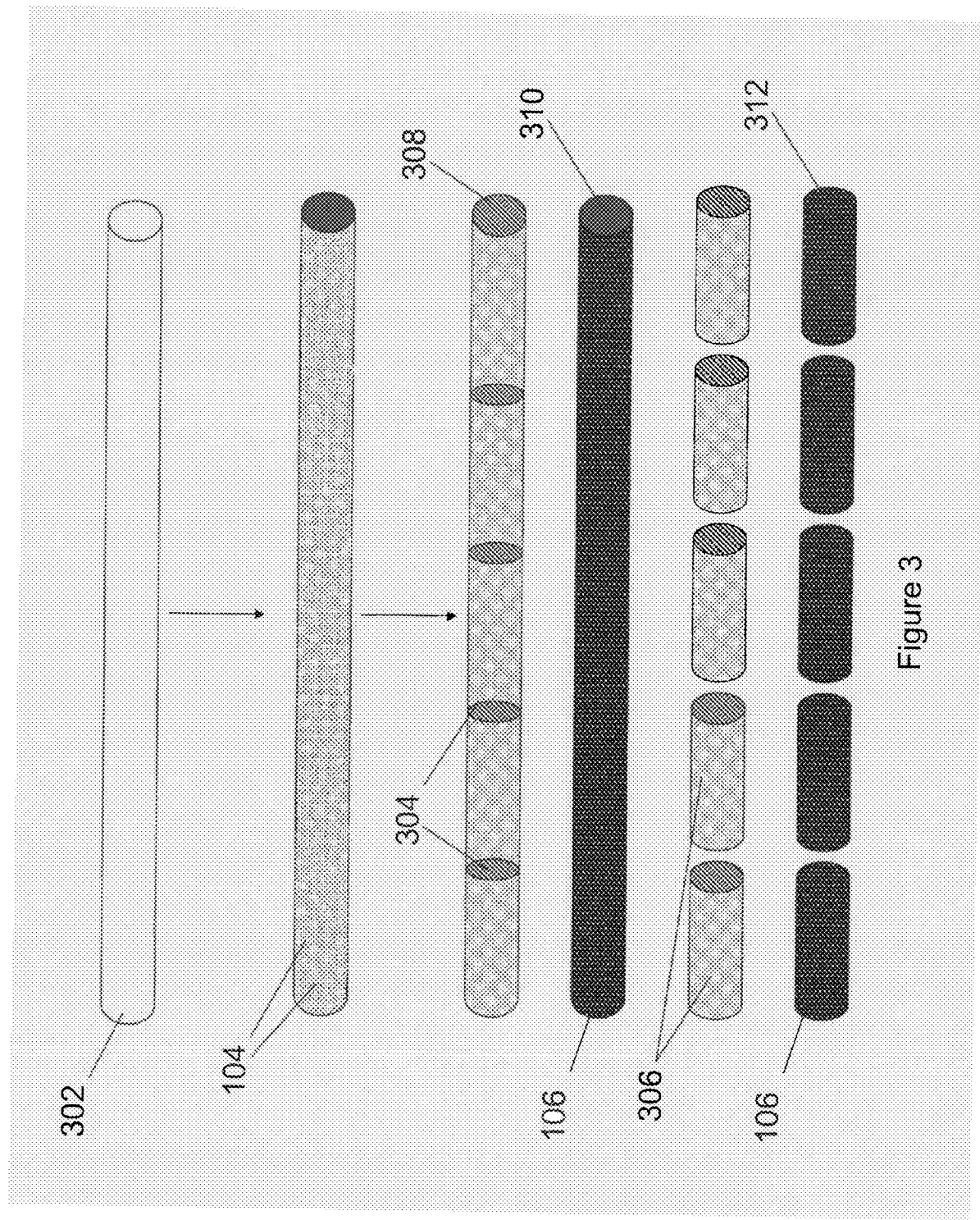
FIG. 3 shows hermetically sealed luminescent nanocrystal compositions, including individually sealed compositions, in accordance with one embodiment of the present invention.
Figure 4:
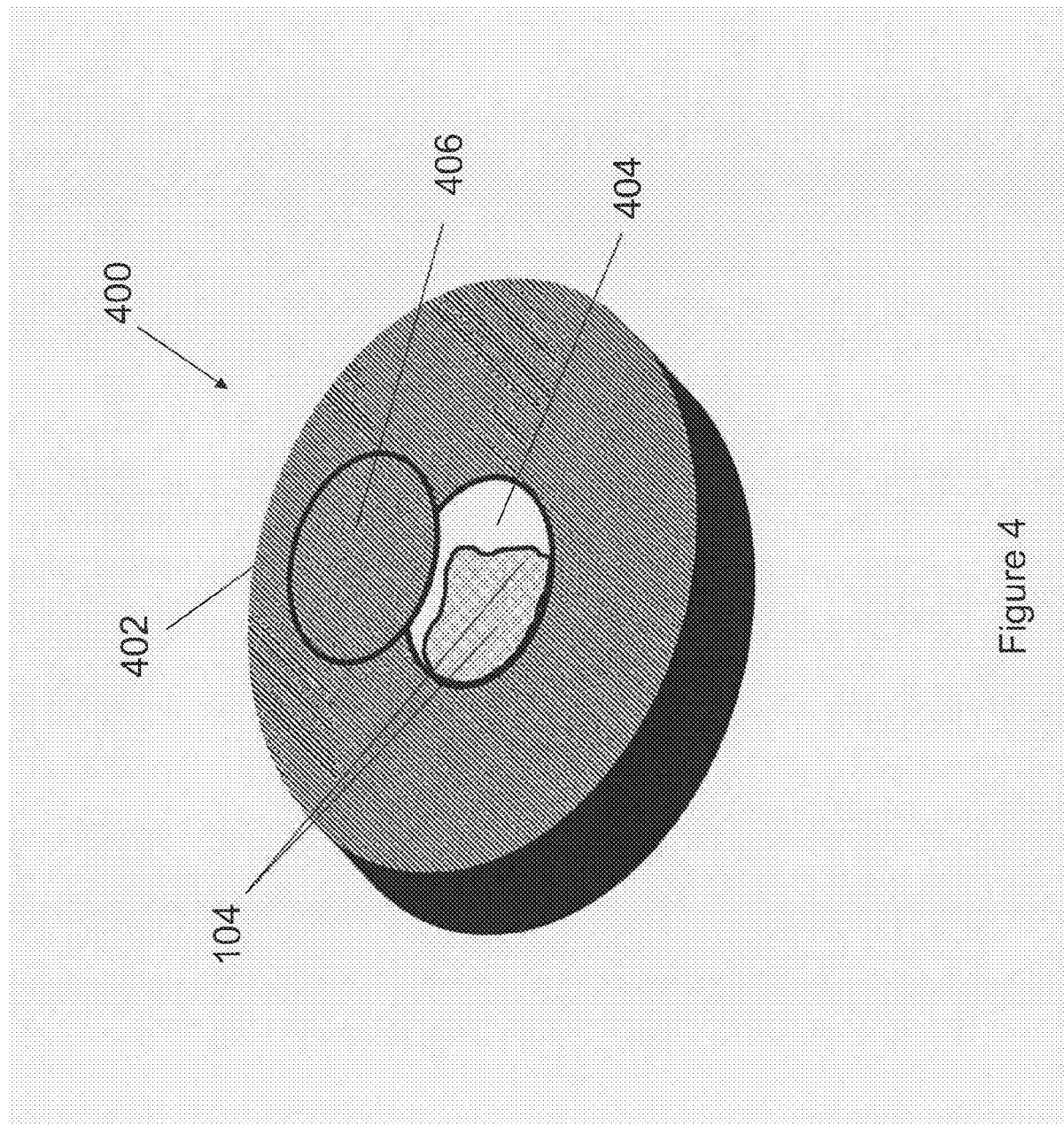
FIG. 4 shows a hermetically sealed container comprising luminescent nanocrystals in accordance with one embodiment of the present invention.

In a further embodiment, the present invention provides methods for hermetically sealing a container which comprises a plurality of luminescent nanocrystals. Suitably the methods comprise providing a container, introducing luminescent nanocrystals into the container, and then sealing the container. For example, an exemplary method for hermetically sealing a container of luminescent nanocrystals is shown in flowchart 200 of FIG. 2, with reference to FIGS. 3 and 4. In step 202 if FIG. 2, a container is provided, for example, containers 302 or 402 in FIGS. 3 and 4 are be provided. As used herein, "container" refers to any suitable article or receptacle for retaining nanocrystals. It should be understood that, as used herein, a "container" comprising luminescent nanocrystals and a "composition" comprising luminescent nanocrystals represent different embodiments of the present invention. A "composition" comprising luminescent nanocrystals refers to a matrix, e.g., a polymer substrate, solution or suspension, which contains nanocrystals dispersed throughout. A "container" as used herein, refers to a carrier, receptacle or pre-formed article into which luminescent nanocrystals are introduced (often a composition of luminescent nanocrystals, e.g., a polymeric matrix comprising luminescent nanocrystals). Examples of containers include, but are not limited to, polymeric or glass structures such as tubes, molded or formed vessels, or receptacles. In exemplary embodiments, a container can be formed by extruding a polymeric or glass substance into a desired shape, such as a tube (circular, rectangular, triangular, oval or other desired cross-section), or similar structure. Any polymer can be used to form the containers for use in the practice of the present invention, including those described throughout. Exemplary polymers for preparation of containers for use in the practice of the present invention include, but are not limited to, acrylics, poly(methyl methacrylate) (PMMA), and various silicone derivatives. Additional materials can also be used to form the containers for use in the practice of the present invention. For example, the containers can be prepared from metals, various glasses, ceramics and the like.

Figure 2:
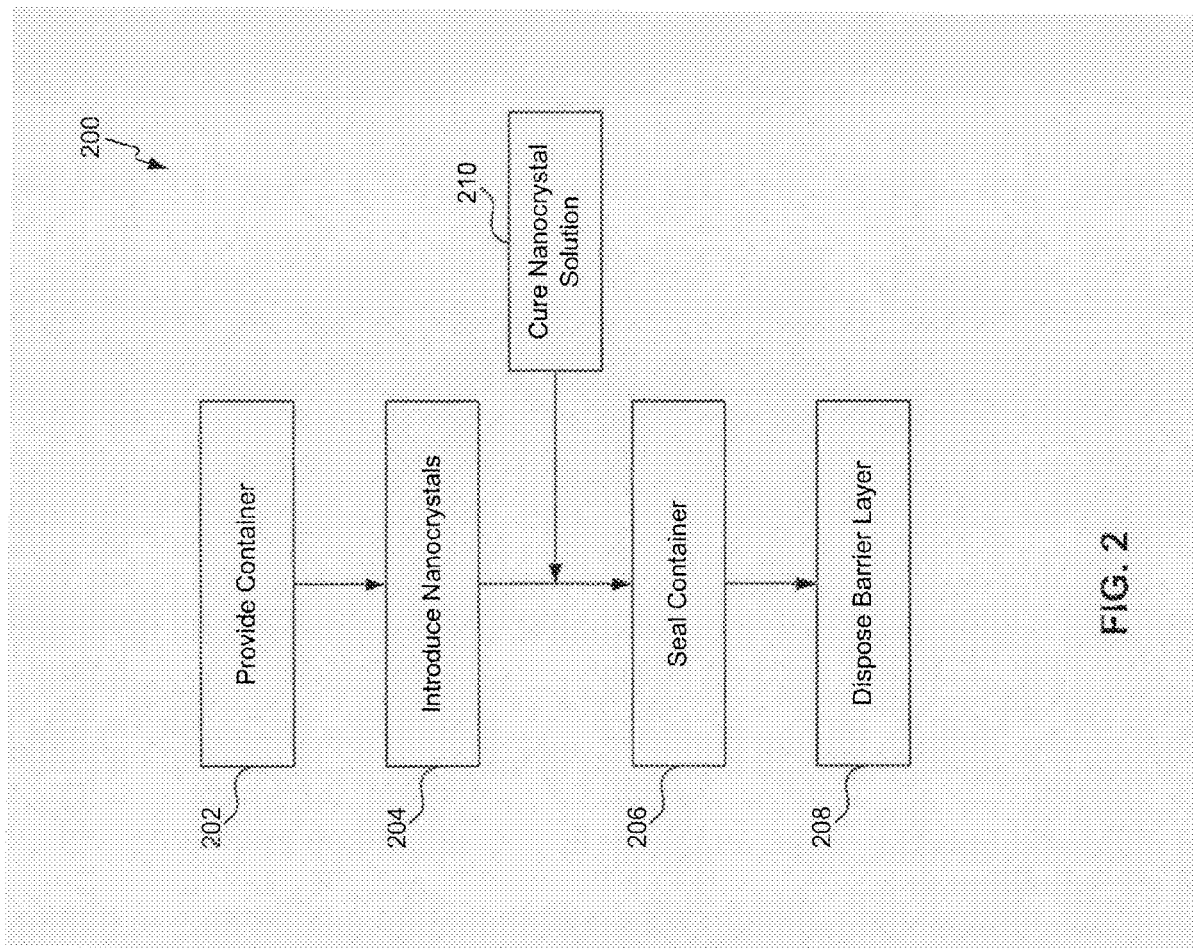
FIG. 2 shows a method for hermetically sealing a container comprising luminescent nanocrystals in accordance with one embodiment of the present invention.

For example, as shown in FIG. 2, once a container is provided in step 202, a plurality of luminescent nanocrystals 104 are then introduced into the container in step 204. As used herein, "introduced" includes any suitable method of providing luminescent nanocrystals into a container. For example, luminescent nanocrystals can be injected into a container, placed into a container, drawn into a container (e.g., by using a suction or vacuum mechanism), directed into a container, for example by using an electromagnetic field, or other suitable method for introducing luminescent nanocrystals into a container. Suitably, the luminescent nanocrystals are present in a solution or suspension, for example in a polymeric solution, thereby aiding in the introduction of the nanocrystals into the container. In exemplary embodiments, luminescent nanocrystals 104 can be drawn into a container, for example a tubular container 302, such as is shown in FIG. 3. In further embodiments, as shown in FIG. 4, a container 402 can be prepared with a cavity or void 404 into which luminescent nanocrystals 104 can be introduced. For example, a solution of luminescent nanocrystals 104 can be introduced into the cavity 404 in container 402.

Following introduction of the luminescent nanocrystals into the container, the container is then hermetically sealed, as shown in FIG. 2, in step 206. Examples of methods for hermetically sealing the container include, but are not limited to, heat sealing the container, ultrasonic welding the container, soldering the container or adhesive bonding the container. For example, as shown in FIG. 3, container 302 can be sealed at any number of positions, creating various number of seals 304 throughout the container. In exemplary embodiments, container 302 can be heat sealed at various positions throughout the container, for example by heating and then "pinching" the container at various sealing points (304).

In suitable embodiments, as shown in FIG. 3, a polymeric or glass tube can be used as container 302. A solution of luminescent nanocrystals 104 can then be drawn into the container by simply applying a reduced pressure to an end of the container. Container 302 can then be sealed by heating and "pinching" the container at various sealing positions or seals 304 throughout the length of the container, or by using other sealing mechanisms as described throughout. In this way, container 302 can be separated into various individual sections 306. These sections can either retained together as a single, sealed container 308, or the sections can be separated into individual pieces, as shown in FIG. 3. Hermetic sealing of container 302 can be performed such that each individual seal 304 separates solutions of the same nanocrystals. In other embodiments, seals 304 can be created such that separate sections of container 302 each contain a different nanocrystal solution (i.e., different nanocrystal composition, size or density).

In a further embodiment, as shown in FIG. 4, luminescent nanocrystals can be placed into a cavity/void 404 formed in container 402. Container 402 can be produced using any suitable process. For example, container 402 can be injection molded into any desired shape or configuration. Cavity/void 404 can be prepared during the initial preparation process (i.e., during molding) or can be subsequently added after formation. Luminescent nanocrystals 104 are then introduced into cavity/void 404. For example, luminescent nanocrystals can be injected or placed into cavity/void 404 of container 402. Suitably, a solution of luminescent nanocrystals will fill the entire container, though it is not necessary to completely fill the container with nanocrystals. In the case where the entire container is not filled, it is necessary though to remove substantially all of the air in the container prior to sealing to ensure that the luminescent nanocrystals are hermetically sealed. As shown in FIG. 4, in exemplary embodiments, container 402 can be hermetically sealed by bonding, welding or otherwise sealing the container with a cover or lid 406. Suitably, cover 406 is produced from the same material as container 402 (and can suitably be partially attached prior to sealing), though it can also comprise a different material. In additional embodiments, a material such as an organic material designed to specifically reduce oxygen and moisture transmission can be used to cover or seal container 402. Examples include filled epoxies (such as alumina filled epoxies) as well as liquid crystalline polymers.

The ability to produce custom designed containers, for example via molding, extruding or otherwise shaping containers, allows for preparation of very specialized parts into which luminescent nanocrystals can be introduced and hermetically sealed. For example, shapes can be produced that conform around LEDs or other light sources (e.g., for use to pipe down-conversion into another optical component). In addition, various films, discs, layers, and other shapes can be prepared. In exemplary embodiments, several different containers can be prepared, each of which can contain different compositions of luminescent nanocrystals (i.e., each composition emitting a different color), and then the separate containers can be utilized together to create the desired performance characteristics. In further embodiments, containers can be prepared with multiple cavities or reservoirs into which luminescent nanocrystals can be introduced.

While luminescent nanocrystals 104 can be hermetically sealed into containers 302, 402, while still in solution, suitably the luminescent nanocrystal solution is cured before hermetic sealing (e.g., in step 210 of FIG. 2). As used herein, "cured" refers to the process of hardening a solution of luminescent nanocrystals (e.g., a polymeric solution). Curing can be achieved by simply allowing the solution to dry and any solvent to evaporate, or curing can be achieve by heating or exposing the solution to light or other external energy. Following curing, the container can be hermetically sealed using the various methods described throughout.

In exemplary embodiments, no additional hermetic sealing is necessary to protect the luminescent nanocrystals from oxidative degradation. For example, sealing luminescent nanocrystals in a glass or polymeric container provides sufficient protection from oxygen and moisture that further modifications are not necessary. However, in further embodiments, an additional level of protection from oxidation can be added to the hermetically sealed containers by disposing a barrier layer on the container. For example, as shown in step 208 of FIG. 2. As described throughout, exemplary barrier layers include inorganic layers, such as inorganic oxides like $SiO_2$, $TiO_2$ and $AlO_2$, as well as organic materials. While any method of disposing the barrier layer onto the container can be used, suitably the barrier layer is sputtered onto the container or disposed onto the container via ALD. As shown in FIG. 3, barrier layer 106 can be disposed on the container with sealed sections, or on individual sections following sealing and separation from one another, thereby producing hermetically sealed containers (310, 312).

In suitable embodiments of the present invention, the various steps to produce a hermetically sealed container of luminescent nanocrystals are performed in an inert atmosphere. For example, steps 204, 206 and 208 (and 210 if required) are all suitably performed in an inert atmosphere, i.e., either in a vacuum and/or with only $N_2$ or other inert gas(es) present.

In further embodiments, the present invention provides hermetically sealed compositions and containers comprising a plurality of luminescent nanocrystals. In exemplary embodiments, the luminescent nanocrystals comprise one or more semiconductor materials (as described throughout), and are suitably core/shell luminescent nanocrystals, such as CdSe/ZnS, CdSe/CdS or InP/ZnS. In general, the luminescent nanocrystals are of a size of between about 1-50 nm, suitably about 1-30 nm, more suitably about 1-10 nm, e.g., about 3-9 nm. In exemplary embodiments, as described throughout, the hermetically sealed compositions and containers of the present invention comprise a barrier layer coating the composition (e.g., barrier layer 106 coating composition 100 in FIG. 1) and optionally comprise a barrier layer coating the containers (e.g., barrier layer 106 coating container 302 in FIG. 3). Exemplary types of barrier layers include those described throughout, such as inorganic layers like $SiO_2$, $TiO_2$, and $AlO_2$.

In addition to generating various shapes, orientations and sizes of containers for hermetically sealing the luminescent nanocrystals, additional modifications can also be made to the containers/compositions. For example, the containers/compositions can be prepared in the shape of a lens for filtration or other modification of a light source. In further embodiments, the containers/compositions can be modified, for example, by preparing or attaching a reflector or similar apparatus to the containers/compositions.

Figure 5:
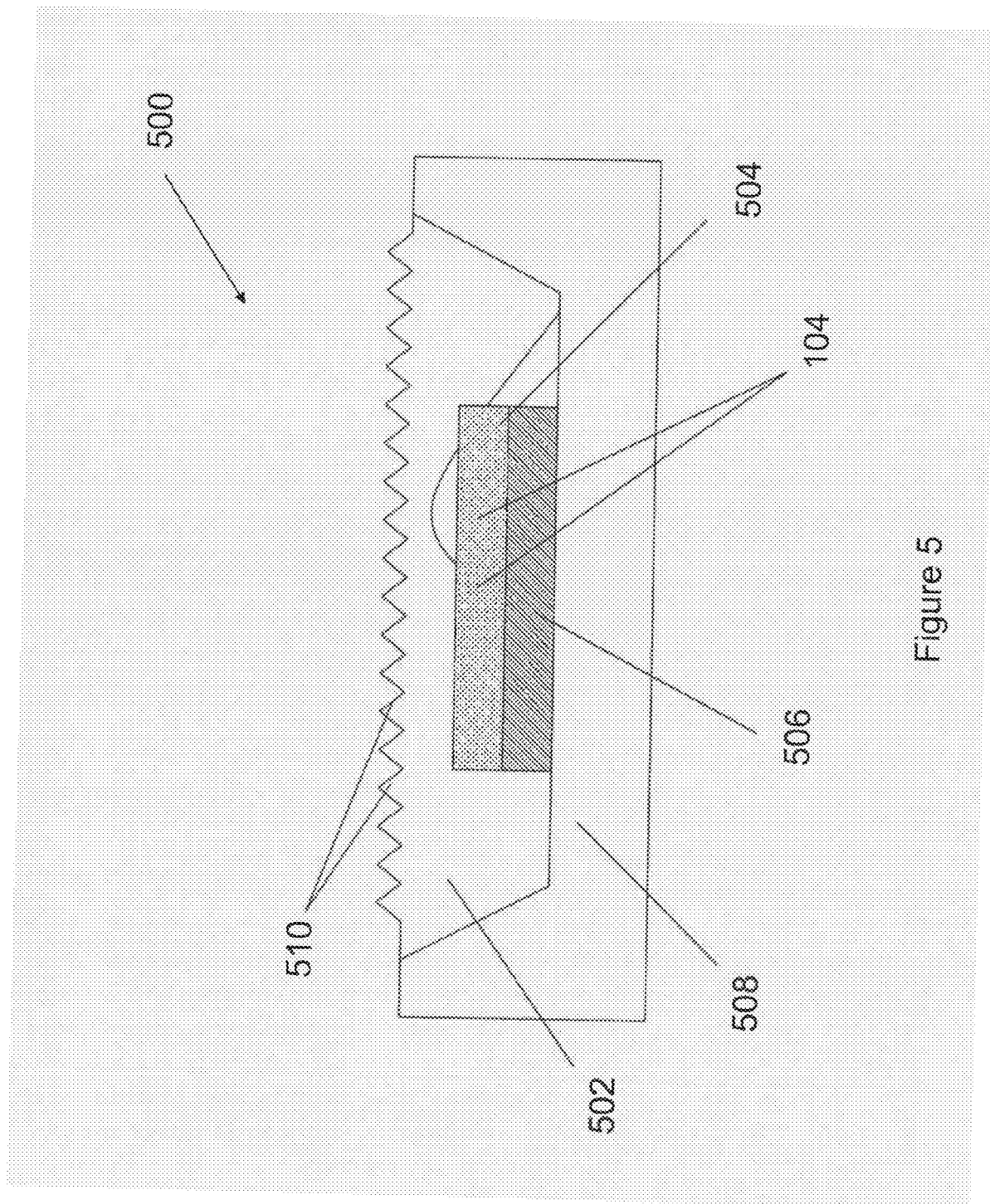
FIG. 5 shows a hermetically sealed composition further comprising a microlens in accordance with one embodiment of the present invention.

Additionally, micropatterns can be molded directly into the compositions or containers to form flat (or curved) microlenses. This can be done during the molding process or in a subsequent embossing step. Micropatterns are often utilized to make flat microlenses when limited space is available, such as in displays. Examples of this technology include the brightness enhancing films from 3M corporation that have 20 to 50 micron prisms molded into their surface. In suitable embodiments, the present invention provides microlenses comprising luminescent nanocrystals hermetically sealed in an encapsulating polymer (or in a container) which is then micropatterned such that a microlens is formed. For example, as shown in FIG. 5, microlens assembly 500 suitably comprises hermetically sealed composition 502 comprising a layer 504 of luminescent nanocrystals 104 placed on top of, or otherwise in contact with, LED 506 which is supported by substrate 508. The surface of composition 502 can be molded into various shapes, for example to include a series of microprisms 510, as shown in FIG. 5, thereby forming the microlens.

In exemplary embodiments, use of a microlens in combination with the hermetically sealed compositions of the present invention allow for an increase in the amount of emitted light captured (and therefore emitted from the composition) from the LED/luminescent nanocrystals. For example, the addition of microprisms or other microlens assembly to the hermetically sealed compositions and containers of the present invention suitably leads to an increase in the amount of light captured of greater than about 10% (e.g., about 10-60%, about 10-50%, about 10-40%, about 20%-40%, or about 30-40%) as compared to a composition that does not comprise microprisms or other microlens assembly. This increase in the amount of light captured correlates directly to an increase in the total amount of light that is emitted from the composition or container.

In suitable embodiments, a dichroic mirror can be attached or otherwise associated with the containers/compositions that forms a lens for application over a light source. A dichroic mirror allows a particular wavelength of light to pass through the mirror, while reflecting others. As light from the source enters the lens-shaped containers/ compositions, the photons are able to enter the containers/ compositions and excite the various luminescent nanocrystals that have been hermetically sealed inside. As the luminescent nanocrystals emit light, photons are able to exit the containers/compositions, but not reflect back toward the initial light source (as they are reflected by the dichroic mirror). In embodiments then, suitable containers/compositions can be created to fit over a light source (e.g., an LED). This allows light to enter from the source and excite the luminescent nanocrystals inside, but emitted light is only allowed to exit the containers/compositions away from the light source, blocked from reflecting back into the source by the dichroic mirror. For example, blue light from an LED source is allowed to pass through the dichroic mirror and excite encapsulated luminescent nanocrystals, which then emit green light. The green light is reflected by the mirror and not allowed to reflect back into the light source.

As discussed herein, in suitable embodiments the hermetically sealed luminescent nanocrystal compositions of the present invention are used in combination with an LED or other light source. Applications for these sealed nanocrystal/LEDs are well known to those of ordinary skill in the art, and include the following. For example, such sealed nanocrystal/LEDs can be used in microprojectors (see, e.g., U.S. Pat. Nos. 7,180,566 and 6,755,563, the disclosures of which are incorporated by reference herein in their entireties); in applications such as cellular telephones; personal digital assistants (PDAs); personal media players; gaming devices; laptops; digital versatile disk (DVD) players and other video output devices; personal color eyewear; and head-up or head-down (and other) displays for automobiles and airplanes. In additional embodiments, the hermetically sealed nanocrystals can be used in applications such as digital light processor (DLP) projectors.

In additional embodiments, the hermetically sealed compositions and containers disclosed throughout can be used to minimize the property of an optical system known as etendue (or how spread out the light is in area and angle). By disposing, layering or otherwise covering (even partially covering) an LED or other light source with a composition or container of the presently claimed invention, and controlling the ratio of the overall area (e.g, the thickness) of the luminescent nanocrystal composition or container to the area (e.g., the thickness) of the LED, the amount or extent of etendue can be minimized, thereby increasing the amount of light captured and emitted. Suitably, the thickness of the luminescent nanocrystal composition or container will be less than about $1/5$ the thickness of the LED layer. For example, the luminescent nanocrystal composition or container will be less than about $1/6$, less than about $1/7$, less than about $1/8$, less than about $1/9$, less than about $1/10$, less than about $1/15$ or less than about $1/20$ of the thickness of the LED layer.

In further embodiments, the hermetically sealed luminescent nanocrystals of the presently claimed invention can be used in a system 602 comprising a light-focusing apparatus (or focusing apparatus) 604, for example, as shown in FIGS. 6A-6C. In exemplary embodiments, a light-focusing apparatus 604 is prepared and attached or otherwise associated with an LED 506. Suitably, light-focusing apparatus 604 is in the shape of a cube or rectangular box, where the bottom of the box situated on or above the LED 506, with the sides of the apparatus extending above the LED. FIG. 6A shows a cross sectional view of apparatus 604, taken through plane 1-1 of FIG. 6B, showing a top view of the apparatus 604, LED 506 and substrate 508. In exemplary embodiments, apparatus 604 comprises four sides surrounding LED 506, though in other embodiments any number of sides can be used (e.g., 2, 3, 4 5, 6, 7, 8, 9, 10, etc.), or a circular apparatus can be used, such that only a single piece (or multiple pieces fashioned for form a continuous piece) of material surrounds LED 506. In general, the top and bottom of light-focusing apparatus 604 are open (i.e., the apparatus is placed directly on top of and encloses LED 506), though in other embodiments, either the top or bottom, or both, of apparatus 604 can be closed by an additional piece of material.

Focusing apparatus 604 suitably is made of a material that can reflect light that is generated by LED, or is coated with a material that reflects light. For example, focusing apparatus can comprise a polymer, metal, ceramic, etc. In other embodiments, the inner surface (i.e., the surface facing LED) can be coated with a reflective material such as a metal (e.g, Al) or other reflective coating. This reflective coating can be deposited on the surfaces of focusing apparatus using any suitable method, such as spray coating, ALD, painting, dipping, spin coating, etc.

Focusing apparatus 604 suitably encloses or encapsulates a hermetically sealed nanocrystal composition 504 (or hermetically sealed nanocrystal container) of the present invention, and thus the apparatus is associated with the composition or container. In suitable embodiments, focusing apparatus 604 can be prepared separately from LED 506 and then attached to the LED, for example by an adhesive such as an epoxy, and then the center portion of the apparatus 604 filled in with a hermetically sealed nanocrystal composition 504. In further embodiments, focusing apparatus 604 can be directly assembled on LED 506. In other embodiments, a hermetically sealed composition can be disposed on LED and then focusing apparatus can be added, either as a pre-made apparatus, or constructed directly on the LED. In suitable embodiments, apparatus 604 also comprises a cover (e.g., a glass or polymer cover) to seal the nanocrystal composition 504. Such a cover can act as a hermetic seal over the nanocrystal composition, or simply as an additional structural element to support the nanocrystal composition and the focusing apparatus. Such a cover can be placed directly on top of nanocrystal composition 504, or can be placed at the top of apparatus 604, or in any position in between.

As shown in FIGS. 6A and 6C, in suitable embodiments, focusing apparatus 604 is prepared in such a manner that the sides of the apparatus taper inward at the bottom (e.g., near the LED), but outward at the top (away from the LED). This helps to aid in gathering and focusing the light 606 into a beam so as to direct the light out of the apparatus. As shown FIG. 6C, suitably focusing apparatus 604 directs light 606 out from the LED. By using tapered or angled sides, light 606 that is emitted from the LED/nanocrystals is directed out of the apparatus 604, rather than lost either by bouncing back and forth inside of the apparatus, or lost simply unable to escape. Use of light-focusing apparatus in combination with the luminescent nanocrystal compositions and containers of the present invention can suitably be employed in microprojectors and other applications where a focus, beam of light is desired or required.

Light-Emitting Diode (LED) Devices with Hermetically Sealed Nanocrystals

In a further embodiment, the present invention comprises light-emitting diode (LED) devices. An exemplary LED device 700 is shown in FIG. 7A. LED device 700 suitably comprises an LED 702. LED 702 is shown on substrate 706 for illustrative purposes only. It should be understood that any suitable configuration of an LED can be utilized in the practice of the present invention. In addition, multiple (i.e., more than one) LED can be utilized in LED device 700. LED device 700 further comprises a hermetically sealed container 708 comprising a plurality of luminescent nanocrystals 710. Container 708 is optically coupled to LED 702. LED device 700 also comprises a light guide 712 optically coupled to hermetically sealed container 708.

In embodiments of the present invention, a first portion of light emitted from the LED is down-converted by the luminescent nanocrystals 710. A second portion of light emitted from the LED and the down-converted light from the luminescent nanocrystals are emitted from light guide 712.

Any suitable LED can be utilized in the LED devices of the present invention, including various configurations of LEDs, and LEDs emitting light over the entire visible spectrum, as well as LEDs that emit ultraviolet light (light with a wavelength of 10 nm to about 380 nm). Suitably, LED 702 emits blue light. As described herein, the visible spectrum includes light having wavelengths between about 380 nm and about 780 nm that is visible to the human eye. Visible light can be separated into the various colors of the spectrum, such as red, orange, yellow, green, blue, indigo and violet. As used herein, blue light comprises light between about 435 nm and about 500 nm, green light comprises light between about 520 nm and 565 nm, more suitably about 525 nm to about 530 nm, and red light comprises light between about 625 nm and about 740 nm in wavelength, more suitably about 625 nm to about 640 nm.

Suitably, as shown in FIG. 7B, LED 702 emits blue light 716. A first portion 718 of the blue light emitted from the LED is down-converted by luminescent nanocrystals 710. As the nanocrystals absorb this portion of blue light and then emit light at a second wavelength 722, 724 (see FIG. 7B). Suitably, the light emitted from nanocrystals 710 comprises light having wavelengths primarily in the green (e.g, between about 520 nm and 565 nm, more suitably about 525 nm to about 530 nm) and red (e.g, between about 625 nm and about 740 nm in wavelength, more suitably about 625 nm to about 640 nm) ranges. Thus, suitably nanocrystals 710 comprise two populations of nanocrystals. One population of nanocrystals is designed to absorb blue light and emit red light, and a second population of nanocrystals is designed to absorb blue light and emit green light. The populations of nanocrystals suitably comprise a plurality (i.e., 2 or more, 10 or more, 100 or more 1000 or more, etc.) of nanocrystals. As described herein, the ability to tailor the composition and size of the nanocrystals allows for the design of nanocrystals having specific absorption and emission characteristics.

"A first portion" of blue light 718 refers to a percentage of the blue light 716 emitted from LED that is down-converted from blue to another wavelength(s) of light. A first portion can be any amount of the original blue light 716 emitted from LED 702 that is less than the total amount of blue light given off by the LED (e.g., about 99% to about 1% of the blue light emitted from LED 702, suitably about 80% to about 30%, about 70% to about 40%, about 70% to about 50% or about 60%).

A second portion 720 of blue light emitted from LED 702 passes through hermetically sealed container 708, emerging as blue light (suitably about 20% to about 50%, or about 20% to about 40%). This second portion of blue light 720 and the down-converted light 722 and 724 emitted from the nanocrystals (e.g., red light and green light) are then emitted 726 from the light guide 712. The blue light emitted from the LED 720, and the down-converted green light and red light (722 and 724) suitably combine to produce white light 726 when ultimately emitted from the light guide.

In further embodiments, two (or more) blue light emitting LEDs can be utilized, so that all of the light from one (or more) LED is down-converted by the nanocrystals, while all of the light from the second (third, etc.) LED passes through the hermetically sealed container, resulting in the red, green and blue wavelengths that combine to produce white light.

Hermetically sealed container 708 is suitably a plastic or glass container. Exemplary hermetically sealed containers are described throughout. In suitable embodiments, the hermetically sealed container is a plastic or glass (e.g., borosilicate) capillary. As used herein "capillary" refers to an elongated container having a length dimension that is longer than both its width and height dimension. Suitably, a capillary is a tube or similar structure having a circular, rectangular, square, triangular, irregular, or other cross-section. Suitably, a capillary for use in the LED devices of the present invention can be configured so as to match the shape and orientation of the LED to which it is optically coupled. In exemplary embodiments, a capillary has at least one dimension of about 100 μm to about 1 mm. In embodiments in which a plastic capillary it utilized, a coating such as $SiO_2$, $AlO_2$ or $TiO_2$, as well as others described herein, can be added so as to provide an additional hermetic seal to the capillary.

Suitably, a capillary of the present invention has a thickness of about 50 μm to about 10 mm, about 100 μm to about 1 mm, or about 100 μm to about 500 μm. Thickness refers to dimension of the capillary into the plane of the light guide. Suitably, a capillary of the present invention has a height (in the plane of the light guide) of about 50 μm to about 10 mm, about 100 μm to about 1 mm, or about 100 μm to about 500 μm. Suitably, a capillary of the present invention has a length (in the plane of the light guide) of about 1 mm to about 50 mm, about 1 mm to about 40 mm about 1 mm to about 30 mm about 1 mm to about 20 mm about 1 mm to about 10 mm.

In still further embodiments a hermetically sealed composition of luminescent nanocrystals as described herein can be utilized in the LED devices. In such embodiments, the hermetically sealed composition is optically coupled to the LED and the light guide, and thus provides the down-converted light from the nanocrystals.

As used herein a "light guide" refers to an optical component that is suitable for directing electromagnetic radiation (light) from one position to another. Exemplary light guides include fiber optic cables, polymeric or glass solid bodies such as plates, films, containers, or other structures. The size of the light guide will depend on the ultimate application and characteristics of the LED devices. In general, the thickness of the light guide will be compatible with thickness of the LED. The other dimensions of the light guide are generally designed to extend beyond the dimensions of the LED, and are suitably on the order of 10s of millimeters, to 10s to 100s of centimeters. While the light guides illustrated in the Figures represent embodiments suitable for use in display systems and the like, other light guides, including fiber optic cables, etc., can also be utilized.

Exemplary nanocrystals for use in the practice of the present invention are described herein. In suitable embodiments, the nanocrystals are core/shell nanocrystals. Suitably, the nanocrystals contain one or more ligands attached to their surface that increase the solubility of the nanocrystals in a polymeric material. Exemplary ligands are described herein and in U.S. patent application Ser. No. 11/034,216, U.S. patent application Ser. No. 10/656,910 and U.S. Provisional Patent Application No. 60/578,236. Exemplary sizes of the nanocrystals are also described herein.

In suitable embodiments, the luminescent nanocrystals comprise CdSe or ZnS. Exemplary core/shell nanocrystals that can be utilized include CdSe/ZnS, InP/ZnS, PbSe/PbS, CdSe/CdS, CdTe/CdS and CdTe/ZnS, nanocrystals. In exemplary embodiments, as described herein, the nanocrystals are dispersed or embedded in a polymeric matrix. This matrix can then be drawn into, or otherwise disposed in, a capillary, prior to sealing the capillary.

In additional embodiments, a scattering material (e.g., particles of material that scatter light entering the hermetically sealed containers) can be added to the matrix. Suitably, the scattering media are metallic, polymeric, semiconductor, or other material particles on the order of 500 nm to microns to even millimeters in size. In other embodiments, a scattering material can be placed between the LED and the hermetically sealed container, or between the container and the light guide.

The concentration of nanocrystals in the hermetically sealed container will depend on the application, size of the nanocrystals, composition of the nanocrystals, composition of the polymeric matrix, and other factors, and can be optimized using routine methods in the art. Suitably, the luminescent nanocrystals are present at a concentration of about 0.01% to about 50%, about 0.1% to about 50%, about 1% to about 50%, about 1% to about 40%, about 1% to about 30%, about 1% to about 20%, about 1% to about 10%, about 1% to about 5%, or about 1% to about 3%, by weight. Suitably, about 40% to about 80%, more suitably about 50% to about 70%, or about 60%, of the light from the LEDs is absorbed by the nanocrystals, with the remaining light suitably passing through the hermetically sealed container. Suitably about 10% to about 40%, or about 20% to about 30% of the light that impacts the container passes through the container without being down-converted.

As described herein, hermetically sealed container 708 is optically coupled to both LED 702 as well as light guide 712. As used herein, "optically coupled" means that a component, (e.g., hermetically sealed container and LED) are positioned so that light is able to pass from one component to another component without substantial interference. Optical coupling includes embodiments in which hermetically sealed container 708 and LED 702 are in direct physical contact, or as shown in FIG. 7A, suitably hermetically sealed container 708 (and thus nanocrystals 710) and LED 702 are spaced apart by a distance 704. While hermetically sealed container 708 is shown in FIG. 7A contacting the top of substrate 706, any suitable configuration can be utilized, so long as light from LED is able to pass to hermetically sealed container 708. For example, hermetically sealed container can be positioned within the space between the top of substrate 706 and LED 702. In other embodiments, an optically transparent element (e.g., a glass or plastic sheet or strip, including a lens) can be placed between hermetically sealed container 708 and LED 704. It should be noted that optical coupling does not require physical interaction between the components. Rather, so long as light is able to pass between the components they are considered optically coupled. The spacing between hermetically sealed container 708 and LED 702 results in the nanocrystals being remotely positioned from the LED. This remote location improves the characteristics (intensity, purity, color rendering, etc.) of the light generated from the LED and the nanocrystals.

In embodiments, light guide 712 is optically coupled to the hermetically sealed container 708 via glue, tape mechanical alignment alone, or the like, and combinations thereof. As shown in FIG. 7A, suitably light guide 712 is directly in contact with hermetically sealed container 708. Tape, glue or other fastening device can be utilized to maintain the physical contact between the two elements. Suitably fastening device is optically transparent, or substantially optically transparent, so as allow light to pass from the hermetically sealed container to the light guide. This can also be accomplished, for example, by utilizing a polymeric light guide, that when heated, melts or deforms such that hermetically sealed container can be contacted to the light guide, and then the light guide cooled, thereby facilitating the formation of a physical adhesion or contact between the two elements.

FIGS. 8A-8C show additional configurations of the LED device described in FIG. 7A. In FIG. 8A, light guide 712 is shown with a tapered edge 802. Tapered edge 802 can help facilitate directing the light emitted from the LED and the nanocrystals into light guide 712. In FIG. 8B, hermetically sealed container 708 can be embedded into light guide 712, as shown at 804. This can be accomplished by, for example, removing a section of light guide 712 such that hermetically sealed container can be directly inserted into light guide 712. In other embodiments, as noted above, light guide 712 can be heated so as to melt or deform, thereby allowing hermetically sealed container 708 to be inserted or embedded into light guide 712. As illustrated in FIG. 8C, in further embodiments, hermetically sealed container 708 can be shaped, as shown in 806. In exemplary embodiments, hermetically sealed container 708 can be shaped so as to act as a lens or other optical device to improve light transfer from the LED to the light guide.

FIG. 9 shows an embodiment of an LED device of the present invention in which the device further comprises one or more reflectors 902 positioned with respect to the LED, light guide and hermetically sealed container, so as to increase the amount of light that is emitted from the light guide. As shown in FIG. 9, in exemplary embodiments a reflector can be positioned behind the LED so as to reflect any light emitted from the nanocrystals in the hermetically sealed container that is not directed into the light guide, or light that bounces back from LED. Similarly, the sides of the hermetically sealed container can also comprise reflectors 902 so as to reflect light toward the light guide. In additional embodiments, the substrate on which the LED is positioned can also comprise reflective, angled sides that help to direct light from the LED into the hermetically sealed container.

FIGS. 10A-10B provide illustrations of an exemplary hermetically sealed container 708, e.g., a capillary. As shown in FIG. 10B, in embodiments, the end of hermetically sealed container 708 (capillary) can be capped with a cap 1002. Cap 1002 is suitably made from a polymeric material that can be heated prior to application, and then cooled so as to seal the hermetically sealed container. In other embodiments, a liquid polymeric solution can be used to fill the end of the hermetically sealed container, thereby sealing the container. Additional methods of sealing the hermetically sealed container, as described herein or otherwise known in the art, for example crimping, pinching, laser sealing, heat shrinking or otherwise closing the end of the container, can also be used.

Suitably, a solution of luminescent nanocrystals dispersed in a polymeric matrix is drawn into a capillary, for example by using a vacuum to generate a reduced pressure. The polymer is then suitably cooled and cured. The curing process can often result in small bubbles forming in the polymeric matrix. It has been discovered that the small size of the bubbles in these preparations does not interfere with the optical properties of the composition or the nanocrystals, and in fact, the presence of these small bubbles may aid in reducing pressure that builds when the matrix is thermally cycled during manufacturing or use with an LED.

In suitable embodiments, the present invention provides white light light-emitting diode (LED) devices. Such devices suitably comprise a blue light light-emitting LED and a hermetically sealed container comprising a plurality of luminescent nanocrystals (suitably CdSe/ZnS luminescent nanocrystals) optically coupled to the LED. The device also comprises a light guide optically coupled the hermetically sealed container.

As illustrated in FIG. 7B, as a first portion of blue light 718 emitted from the LED enters the hermetically sealed container, the light is down-converted by the luminescent nanocrystals (e.g., CdSe/ZnS luminescent nanocrystals) to green light and red light (722 and 724). A second portion of blue light emitted from the LED 720, the green light and the red light, are emitted from the light guide and combine to produce white light 726.

As described herein, the white light LED devices of the present invention suitably comprise a hermetically sealed container comprising luminescent nanocrystals spaced apart (remote) from the LED. The concentration of nanocrystals within the hermetically sealed container is provided such that a portion of the blue light emitted by the LED is able to pass through the container without being absorbed by the nanocrystals. Another portion of the blue light is absorbed, and then down-converted by the nanocrystals and emitted as green and red light. The red, blue and green light then combine to produce white light when emitted from the light guide. The approach of the present invention differs from white light LEDs in which three separate light sources (e.g., three LEDs) are utilized, or where all of the blue light from the LED is absorbed by the luminescent nanocrystals. By optimizing the concentration/density and characteristics of the nanocrystals, high intensity, high purity, precisely color tuned, white light can be produced.

In further embodiments, the present invention provides light-emitting diode (LED) devices, comprising an LED, a hermetically sealed container comprising a plurality of luminescent nanocrystals optically coupled to the LED, and a light guide optically coupled to the hermetically sealed container. Light emitted from the LED is down-converted by the nanocrystals, and exits a surface of the light guide. Suitably, the luminescent nanocrystals emit blue, green and red light, and the light combines to produce white light. In such embodiments, the LED suitably emits ultraviolet light.

In further embodiments, the present invention provides display systems comprising the LED devices described herein. Suitably, as shown in FIG. 11, the display systems 1100 comprise a display 1102, and a plurality of LED devices 700. As described herein, suitably LED devices 700 comprise an LED 702 and a hermetically sealed container 708 comprising a plurality of luminescent nanocrystals optically coupled to the LED. The devices also comprise a light guide 712 optically coupled to the hermetically sealed container. As shown in FIG. 11, suitably, display 1102 at least partially encloses light guide 712.

In embodiments, down converted light emitted from the luminescent nanocrystals is emitted from the light guide and displayed on the display. The display systems of the present invention are capable of emitting light over the full range of the visible spectrum, including white light.

In further embodiments, a first portion of light emitted from the LED is down-converted by the luminescent nanocrystals. A second portion of light emitted from the LED and the down-converted light from the luminescent nanocrystals are emitted from the light guide and displayed on the display. The display systems of the present invention are capable of emitting light over the full range of the visible spectrum, including white light. In exemplary embodiments, the LEDs utilized emit blue light.

Exemplary hermetically sealed containers (including capillaries) and luminescent nanocrystals are described herein. As shown in FIG. 11, suitably a single hermetically sealed container 708' is optically coupled to at least two LEDs. A single hermetically sealed container can be optically coupled to two or more, three or more, four or more, five or more, ten or more, etc., LEDs. While a hermetically sealed container 708 can be coupled to each individual LED, in the display system embodiments of the present invention, use of a single hermetically sealed container which is coupled to multiple LEDs allows for easier assembly and manufacture of the display systems. In embodiments in which a single hermetically sealed container is coupled to multiple LEDs, each LED suitably emits blue light, a portion of which is down-converted by the nanocrystals in the container, and a portion of which is emitted from the light guide. While FIG. 11 demonstrates an embodiment in which a single light guide and a single display are utilized, it should be understood that the display systems of the present invention can comprise multiple light guides and multiple displays optically coupled to each other to result in a display system.

The hermetically sealed containers comprising luminescent nanocrystals as described herein can be utilized to retrofit existing LED display systems. By including the hermetically sealed containers (e.g., capillaries) between the LEDs and light guides of a display, a portion light from the LEDs (suitably blue light) can be converted to any desired color, including combining with the LED light to produce white light.

Table 1 below shows the light output from luminescent nanocrystals of the present invention, as well as light from the blue LED used to excite the nanocrystals. The nanocrystals were spaced apart from the LED (remote from the LED) as described herein. Data is also shown for traditional Yttrium Aluminum Garnet (YAG) phosphors. FWHM=full width at half maximum.

TABLE 1

| Spectrum Characteristics | YAG | Luminescent Nanocrystals |
|---|---|---|
| Blue Peak (nm) | 451.8 | 463.5 |
| Blue FWHM (nm) | 21.6 | 21.6 |
| Green Peak (nm) | N/A | 535.3 |
| Green FWHM (nm) | N/A | 32.8 |
| Yellow Peak (nm) | 559 | N/A |
| Yellow FWHM (nm) | 105 | N/A |
| Red Peak (nm) | N/A | 614.5 |
| Red FWHM (nm) | N/A | 44.5 |

Luminescent Nanocrystal Composites

Figure 12:
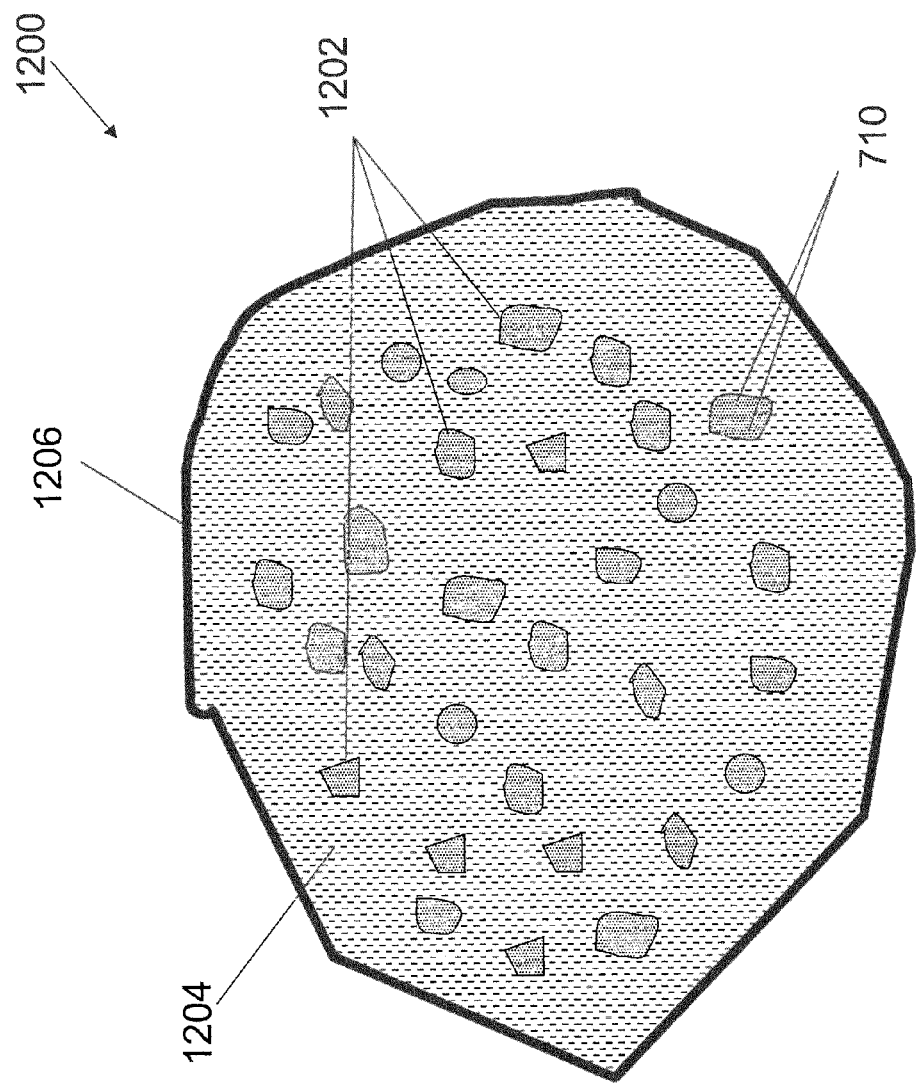
FIG. 12 shows a luminescent nanocrystal composite material in accordance with an embodiment of the present invention.

In a still further embodiment, the present invention luminescent nanocrystal composite materials 1200. As shown in FIG. 12, in embodiments, the composite materials comprise a first polymeric material 1204 having a first composition, a second polymeric 1202 material having a second composition, and a plurality of luminescent nanocrystals 710 dispersed in second polymeric material 1202. The, second polymeric material 1202 is dispersed in first polymeric material 1204.

Dispersing luminescent nanocrystals in second polymeric material 1202 provides a method to seal the nanocrystals and provide a mechanism for mixing various compositions and sizes of nanocrystals. Suitable second polymeric materials 1202 include aminosilicone, as well as other polymers described herein, including, but not limited to, poly(vinyl butyral):poly(vinyl acetate); epoxies; urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including but not limited to, methylmethacrylate, butylmethacrylate and laurylmethacrylate; styrene based polymers; and polymers that are cross linked with difunctional monomers, such as divinylbenzene.

While second polymeric material 1202 provides a suitable environment for dispersing the nanocrystals, the polymers that provide efficient mixing of the nanocrystals can often be brittle or difficult to shape or mold. Dispersing the nanocrystal/polymer mixture 1202 in a further polymeric material 1204 allows for the production of a composite that maintains the desired optical/down-conversion characteristics of the luminescent nanocrystals, while also maintaining a hermetically sealed composition that is also able to be mechanically worked as desired. Exemplary polymeric materials for use as first polymeric material 1204 include epoxies and polycarbonates. Exemplary epoxies and polycarbonates are well known in the art.

Suitably the luminescent nanocrystals dispersed in the composite materials absorb light (e.g., blue light) and emit green light and/or red light, though other colors can also be emitted from the nanocrystals. Exemplary nanocrystals for use in the composite materials are described herein and include nanocrystals comprise that CdSe or ZnS, as well as core/shell luminescent nanocrystals comprising CdSe/ZnS, InP/ZnS, PbSe/PbS, CdSe/CdS, CdTe/CdS or CdTe/ZnS.

In further embodiments, the composites can comprise an inorganic layer 1206 that hermetically seals the composite. Examples of inorganic layers are described herein, and include, $SiO_2$, $TiO_2$ or $AlO_2$.

Suitably, the composite materials of the present invention have an optical density of about 0.5 to about 0.9 at the blue LED wavelength and a path length of about 50 μm to about 200 μm. Suitably, the composites have an optical density of about 0.5 to about 0.8, about 0.7 to about 0.8, or about 0.8 at the blue LED wavelength. Suitably, the path length of the composite materials is about 75 μm to about 150 μm, or about 100 μm. The concentration of luminescent nanocrystals utilized in the composite materials of the present invention is suitably about the same as the concentration utilized in the hermetically sealed compositions described herein. Thus, the luminescent nanocrystals are suitably present at a concentration of about 0.01% to about 50%, about 0.1% to about 50%, about 1% to about 50%, about 1% to about 40%, about 1% to about 30%, about 1% to about 20%, about 1% to about 10%, about 1% to about 5%, or about 1% to about 3%, by weight, such that about 40% to about 80%, more suitably about 50% to about 70%, or about 60%, of the light that impacts the composite is absorbed by the nanocrystals.

The present invention also provides methods of preparing luminescent nanocrystal composite materials. As shown in flowchart 1300 of FIG. 13, with reference to FIG. 12, suitably such methods include step 1302, comprising dispersing a plurality of luminescent nanocrystals 710 in a first polymeric material 1202 to form a mixture of the luminescent nanocrystals and the first polymeric material. The mixture is then cured in 1304. In 1308, a particulate is generated from the cured mixture. In step 1310, the particulate is dispersed in a second polymeric material 1204 to generate a composite material. The particulate can be dispersed in the second polymeric material using various forms of mechanical mixing when the second polymeric material is in a liquid, or mostly liquid, state.

Exemplary polymeric materials for use in the methods are described herein, as are suitable luminescent nanocrystals. Suitably, the luminescent nanocrystals comprise CdSe or ZnS, or are core shell nanoparticles comprising CdSe/ZnS, InP/ZnS, PbSe/PbS, CdSe/CdS, CdTe/CdS or CdTe/ZnS, and are suitably dispersed in aminosilicone.

Suitably the mixture of luminescent nanocrystals and the first polymeric material are mechanically processed to form the particulate. Examples of mechanical processing include ball milling, grinding, pulverizing, crushing or otherwise forming a particulate from the mixture. Chemical or other treatments can also be utilized to generate a particulate. Suitably the particulate is a powder. Suitably, the particulate of the mixture of the nanocrystals and the first polymeric material has a size on the order of about 10 μm to about 200 μm, or about 10 μm to about 100 μm, or about 20 μm to about 70 μm, or about 50 μm.

Other structures of the mixture of the luminescent nanocrystals and the first polymeric material beyond particulates can also be generated, for example, films, rods, ribbons, spheres, etc. These structures can then be dispersed in the second polymeric material.

In further embodiments, the second polymeric material can be replaced with other materials, such as ceramics, glasses, or inorganic materials that have the desired optical and physical properties of the final desired product.

In exemplary embodiments, a cross-linker is added in step 1306 to the mixture prior to the curing in 1304. Exemplary cross-linkers are described herein or otherwise known in the art.

Figure 13:
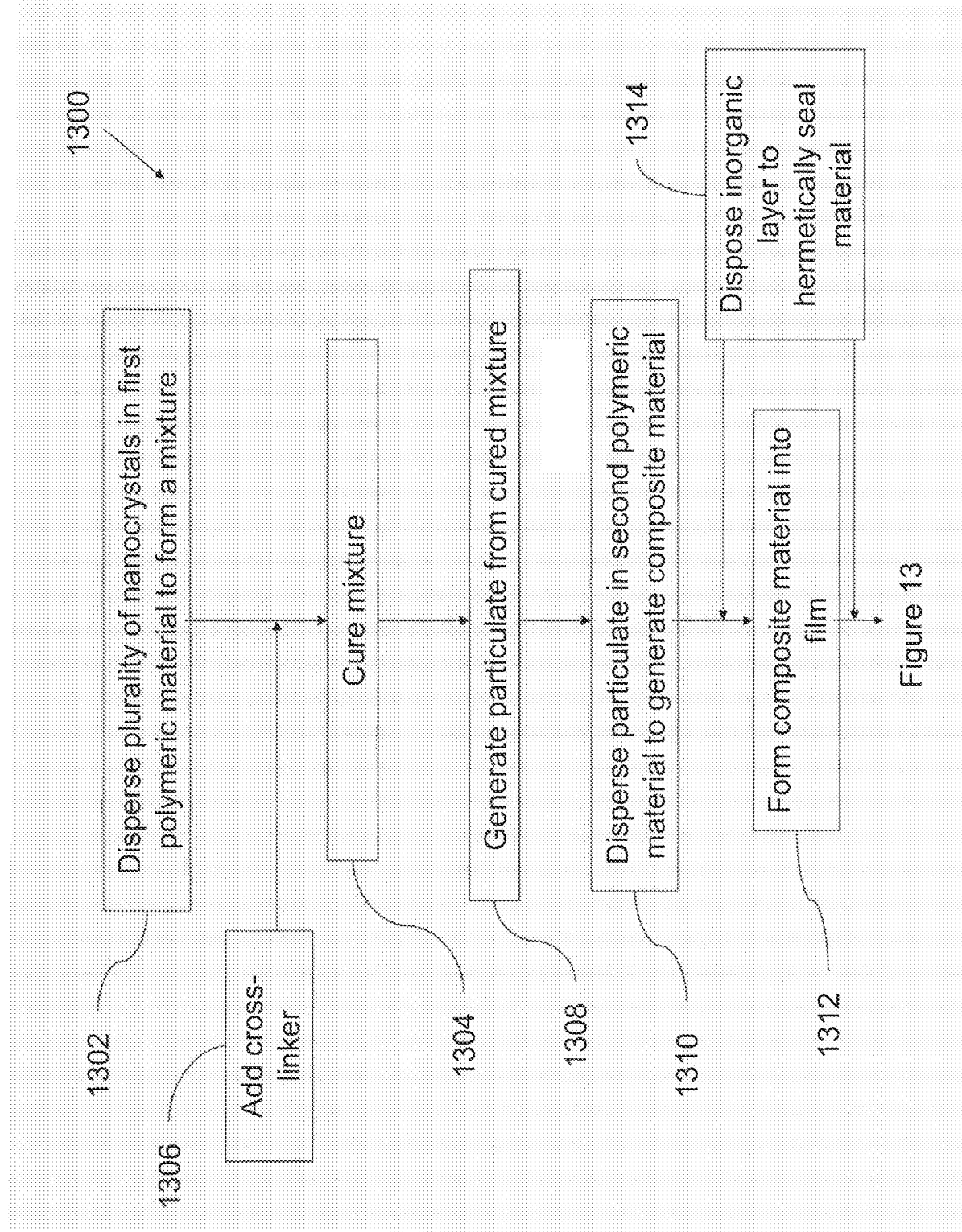
FIG. 13 shows a flowchart of a method of preparing a luminescent nanocrystal composite material in accordance with an embodiment of the present invention.

In further embodiments, as shown in FIG. 13, the methods can further comprise step 1312 of forming the composite material into a film. Suitably, the composite mixture is cast onto a substrate, such as a non-stick substrate, for example a sheet of TEFLON®. After the mixture has been cured, the cured film can be removed from the non-stick substrate. The film can then be cut or diced into any desired size or shape.

In additional embodiments, as shown in step 1314 of flowchart 1300, an inorganic layer can be disposed on the composite so as to provide a further hermetic seal to the composite. The inorganic layer can be disposed after formation of the composite material, but prior to formation of the composite into a film, or the inorganic layer can be disposed following the film formation (including following dicing/cutting into a desired shape). Methods of disposing an inorganic layer on the composite are described herein, and include various methods of coating, spraying, ALD, dipping etc.

The composite material can also be extruded, molded, solvent cast, compression molded, etc., to form the desired shape and configuration of the composite. Methods and parameters for carrying out these techniques are well known in the art.

The composite materials of the present invention can be utilized in the down-converting applications as described herein, or in other applications where a down-converting layer/film/structure is desired. Thus, in exemplary embodiments, a layer, film, tube, strip or other suitable structure can be prepared from the composite materials and optically coupled to an LED (and/or a light guide) so as to provide the down-conversion of light from an LED as described herein.

Light Guides Comprising Nanocrystals

In a still further embodiment, the present invention provides light-emitting diode (LED) devices as shown in FIGS. 14A-14B. Suitably, LED devices 1400 and 1401 comprise an LED 702, and a light guide 712 optically coupled to the LED. A plurality of luminescent nanocrystals 710 are dispersed in a region (1404, 1404') within the light guide. Suitably, the region extends along a length 1410 of the light guide. Suitably, the nanocrystals emit blue light, red light and green light. In embodiments, the LED is an ultraviolet (UV) light emitting LED.

In further embodiments, a first portion of light emitted from the LED is down-converted by the nanocrystals. As shown in FIGS. 14A and 14B a second portion of light (1412) emitted from the LED, and the down-converted light (1414 and 1416), exit a surface of the light guide.

As described throughout, luminescent nanocrystals of the present invention suitably absorb light of a specified wavelength and then down-convert the absorbed light, emitting light at a different wavelength. In the embodiments of the present invention illustrated in FIGS. 14A-14B, the luminescent nanocrystals 710 are dispersed in a region 1404 and 1404' of the light guide. Light that is emitted from the LED travels through the length of the light guide 1410, suitably reflecting off of reflectors along the surface of the light guide. In embodiments, a portion of the light emitted from the LED is emitted from the surface of the light guide as shown at 1412. A further portion of the light emitted from the light guide is absorbed by the luminescent nanocrystals and down-converted. This down converted light (1414 and 1416) is then emitted from the light guide. In further embodiments, all of the light emitted from the LED is down-converted by the nanocrystals.

In exemplary embodiments, the LED is a blue light emitting LED. As discussed in detail herein, in exemplary embodiments, a portion of the blue light emitted from the LED is down-converted by the luminescent nanocrystals into red light and green light. When the emitted green 1414 and red 1416 light combine with the portion of blue light 1412 emitted from the LED (that has not been down-converted), white light is emitted from the surface of the light guide. In suitable embodiments, light guide 712 comprises one or more features 1406 on the emitting surface(s) of the light guide. Features 1406 are suitably patterns etched into, or formed from, the surface of light guide 712 that aid in the transmission of light from the light guide. In embodiments, features 1406 are designed to enhance the emission of light that is emitted directly from the LED (including blue light).

In further embodiments, the LED is a UV light emitting LED, and substantially all of the light emitted from the LED is down-converted by the nanocrystals to red, green and blue light. The light is then emitted from the light guide and combines to produce white light.

Exemplary nanocrystals for use in the regions within the light guides are described herein. Suitably, the nanocrystals CdSe or ZnS, or are core/shell nanocrystals, suitably comprising CdSe/ZnS, InP/ZnS, PbSe/PbS, CdSe/CdS, CdTe/CdS or CdTe/ZnS.

As used herein, "region" refers to a section or portion of the light guide into which luminescent nanocrystals have been disposed. Suitably, as shown in FIGS. 14A-14B, regions 1404 and 1404' extend along the length 1410 of light guide 712. The length 1410 of the light guide is the lateral dimension extending perpendicular (or substantially perpendicular) to the LED. By orienting light guide 712 with respect to LED 702 as shown in FIGS. 14A and 14B, light from LED 702 impacts a greater portion of the nanocrystals 710 within the regions 1404 and 1404' prior to exiting the light guide. Suitably, region 1404/1404' is a layer of luminescent nanocrystals. The dimensions of region 1404/1404' are dictated by the overall dimensions of the light guide, though generally the thickness of the region will be in proportion to the size of the LED (i.e., on the order of 10s of microns to 10s of millimeters or so), while the dimensions in the plane of the light guide (i.e., length and width), suitably span the entire light guide. In other embodiments, the region comprising the nanocrystals can be throughout the entire light guide in all dimensions (i.e., dispersed throughout the light guide).

Region 1404/1404' can be generated by dispersing nanocrystals in a polymeric matrix and then forming the light guide around the polymer either prior to or after curing the polymer. Alternatively, the light guide can be prepared and then nanocrystals injected, painted, sprayed, or otherwise deposited so as to form the region. Other methods for generating a polymeric matrix, including the methods described herein with regard to formation of polymeric composites can also be utilized to form the regions. In exemplary embodiments, the luminescent nanocrystal composite materials 1200 described herein can be utilized to prepare the regions in the light guides.

Dispersing luminescent nanocrystals in a region within the light guide provides numerous benefits and advantages to the overall system. For example, more uniform illumination of the nanocrystals can be achieved, thereby reducing the presence of local hot spots. Dispersing the nanocrystals throughout the region allows for improved heat dissipation from the nanocrystals, thus lowering the overall temperature of the nanocrystals. By reducing the optical path length from the nanocrystals to the top surface of the light guide, any loss in efficiency due to reabsorption of green and red photons is reduced. In addition, a low concentration of nanocrystals can be utilized in the region, thus lowering possible photo- and thermal-induced interactions between nanocrystals and the material in which the nanocrystals are dispersed (e.g., a polymer), thereby increasing system life-time.

The concentration of luminescent nanocrystals in the region of the light guide will depend on the application, size of the nanocrystals, composition of the nanocrystals, composition of the polymeric matrix, and other factors, and can be optimized using routine methods in the art. Suitably, the luminescent nanocrystals are present at a concentration that is less than the concentration utilized in the LED device embodiments described herein utilizing a hermetically sealed container, suitably about 0.01% to about 50%, about 0.1% to about 50%, about 1% to about 50%, more suitably about 1% to about 40%, about 1% to about 30%, about 1% to about 20%, about 1% to about 10%, about 1% to about 5%, or about 1% to about 3%, by weight. In general, the concentration of luminescent nanocrystals scales proportionally based on the size of the light guide. Thus, the concentration of luminescent nanocrystals utilized in a hermetically sealed container having a thickness of approximately 100 mm will be reduced by two orders of magnitude for a light guide that is about 10 cm in length, for example.

In exemplary embodiments, region 1404' has a thickness that varies along the length 1410 of the light guide. As shown in FIG. 14B, suitably the thickness of region 1404' increases along the length 1410 of the light guide, from a minimum 1406 at the LED, to a maximum at the far end of the light guide 1408, away from the LED. In exemplary embodiments, the thickness increases approximately linearly along the length of the light guide. In further embodiments, the thickness can increase in a non-linear manner, and/or can achieve a maximum thickness before reaching the far end of the light guide 1408. It should be noted that the schematic shown in FIG. 14B showing the thickness of region 1404' increasing linearly both along the top and bottom of the region is for illustrative purposes only and any appropriate shape/orientation of region 1404' can be utilized. Varying the thickness of the region provides more uniform light illumination from the light guide.

FIGS. 15A-15C show the intensity of light emitted from the light guide shown in FIG. 14A. The intensity is shown as a function of relative distance along the light guide, beginning at zero (0), adjacent the LED (1406), to one (1), the far end of the light guide away form the LED (1408). FIG. 15A shows the intensity of blue light that is both emitted from the LED (going forward) and reflected within the light guide prior to being emitted. FIG. 15B shows the intensity of green and red light emitted from the nanocrystals resulting from both blue light that is absorbed directly from the LED (going forward) as well as blue light that is reflected. Finally, FIG. 15C illustrates a plot of intensity showing the combined sum of all blue light emitted from the light guide (sum of blue), as well as the combined sum of all green and red light (sum of green/red). As demonstrated in FIG. 15C, the intensity of both the blue light and the green/red light diminishes along the length of the light guide. The blue light diminishes as a result of absorbance throughout the length of the light guide. As the amount of nanocrystals in the region of the light guide are constant (due to a uniform thickness of the region), the intensity of the red and green light also reduce along the length of the light guide.

FIGS. 16A-16C show intensity plots similar to those in FIGS. 15A-15C, but for the light guide configuration illustrated in FIG. 14B (region 1404' with nanocrystals that has a varying thickness). The amount of blue light emitted both going forward and reflected are similar to the constant thickness region. However, in comparing the intensity of green/red light in FIGS. 16B-16C to 15B-15C, it can be seen that a better uniformity of green/red light is emitted from the light guide having the region with varying thickness (1404'). This is most likely a result of the increased thickness of region 1404' at the end of the light guide away from the LED. As there are more nanocrystals present at the far end of the light guide (even though the concentration may be consistent throughout the light guide), more blue light can be absorbed and down-converted into green and red light.

The present invention also provides display systems comprising a display, a plurality of LEDs and a light guide optically coupled the LEDs, wherein the display at least partially encloses the light guide. As described herein, a plurality of luminescent nanocrystals are dispersed in a region within the light guide, the region extending along a length of the light guide. Light from the LED is down-converted by the nanocrystals, exits the light guide, and is displayed on the display. In embodiments, the LED is a UV light emitting LED and the nanocrystals emit red, green and blue light.

In other embodiments, a first portion of light emitted from the LED is down-converted by the luminescent nanocrystals, and a second portion of light emitted from the LED and the down-converted light from the luminescent nanocrystals are emitted from the light guide and displayed on the display. As described herein, in exemplary embodiments the LED emits blue light, and the first portion of blue light emitted from the LED is down-converted by the luminescent nanocrystals to green light and red light. Suitably, the second portion of blue light, the green light and the red light combine to produce white light.

Exemplary nanocrystals, including core shell nanocrystals, are described herein. In exemplary embodiments the light guide comprises one or more reflectors.

Suitably, the region comprising the luminescent nanocrystals is a layer of nanocrystals. In exemplary embodiments, the thickness of the region varies along the length of the light guide, suitably increasing from the LED along the length of the light guide, for example, linearly, as described herein.

EXAMPLES

The following examples are illustrative, but not limiting, of the method and compositions of the present invention. Other suitable modifications and adaptations of the variety of conditions and parameters normally encountered in nanocrystal synthesis, and which would become apparent to those skilled in the art, and are within the spirit and scope of the invention.

Example 1

Preparation of Hermetically Sealed Containers

A rectangular tube of approximate dimensions 3 mm×0.5 mm with a 2 mm×0.5 mm cavity is prepared by extrusion of PMMA. The length of tubing is then filled with a solution comprising fluorescent luminescent nanocrystals. The luminescent nanocrystal solution is then cured. Segments of the tubing are then heat sealed to trap the nanocrystals in the tubing. Suitably the filling and sealing are performed in an inert atmosphere. A barrier layer (e.g., $SiO_2$, $TiO_2$ or $AlO_2$) can then be disposed on the outer surface of the tubing.

A drawn glass capillary can also be used to prepare a hermetically sealed container comprising nanocrystals. The end of the capillary is sealed either via melt sealing or plugging with a solder or adhesive or similar structure. The capillary can be filled with a solution of luminescent nanocrystals such that the entire volume of the capillary is filled with the same nanocrystal solution, or the capillary can be filled in stages, such that different nanocrystals are separated along the length of the capillary. For example, a first luminescent nanocrystal solution can be introduced into the capillary, and then a seal placed adjacent to the solution (for example, but melt sealing or plugging the capillary). A second luminescent nanocrystal solution can then be added to the capillary, and again, a seal placed adjacent to the solution. This process can be repeated as often as required until the desired number of individual, hermetically sealed nanocrystal segments are created. In this manner, different compositions of luminescent nanocrystals can be separated from each other in the same container, thereby allowing the production of containers comprising multiple compositions (e.g., colors) of luminescent nanocrystals. In a similar embodiment, a multi-lumen capillary can be used in which different compositions of luminescent nanocrystals (e.g., those which emit different colors) can be introduced and thus kept separate from each other, and still be hermetically sealed from external air and moisture.

Example 2

Preparation of Nanocrystals Composite Materials

Luminescent nanocrystals (e.g., CdSe/ZnS) that emit red (630 nm) and green (530 nm) light are mixed at a 3% weight concentration into an aminosilicone polymer. The aminosilicon polymer has a viscosity of 350 centipoises, and comprises 5% amino groups and 95% dimethylsiloxane. The resulting composition has an optical density of about 0.8 and a path length of 100 μm.

An epoxide cross linker is added and the material is cured to form a rubber. The cured quantum dot composition is then placed into a ball mill and ground into a 50 μm powder.

The powder is then mixed into a two part epoxy at about 30% loading, and the polymer is degassed. The refractive index of the nanocrystals and the epoxy are suitably matched so as to minimize light scattering and the resulting absorptions by the nanocrystals.

The epoxy/nanocrystal mixture is cast onto a TEFLON® sheet at a thickness of about 300 μm. After curing, the film is removed. The optical density of the final composite material is about 0.8 OD.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A method of preparing a luminescent nanocrystal composite material, the method comprising:
    (a) dispersing a plurality of luminescent nanocrystals in a first polymeric material to form a mixture of the luminescent nanocrystals and the first polymeric material;
    (b) curing the mixture;
    (c) generating a particulate from the cured mixture; and
    (d) dispersing the particulate in a second polymeric material to generate the composite material.

2. The method of claim 1, wherein the dispersing in (a) comprises dispersing the luminescent nanocrystals in aminosilicone.

3. The method of claim 1, wherein the dispersing in (a) comprises dispersing luminescent nanocrystals comprising CdSe or ZnS.

4. The method of claim 1, wherein the dispersing, in (a) comprises dispersing luminescent nanocrystals comprising CdSe/ZnS, InP/ZnS, PbSe/PbS, CdSe/CdS, CdTe/CdS, or CdTe/ZnS.

5. The method of claim 1, comprising adding a crosslinker to the mixture prior to the curing in (b).

6. The method of claim 1, wherein the generating a particulate comprises ball milling the cured mixture.

7. The method of claim 1, wherein the generating a particulate comprises grinding the cured mixture.

8. The method of claim 1, wherein the generating a particulate comprises mechanically processing the particulate into a powder.

9. The method of claim 1, further comprising disposing an inorganic layer on the composite material.

10. The method of claim 9, wherein the inorganic layer is disposed after formation of the composite material.

11. The method of claim 9, wherein the inorganic layer is disposed after formation of the composite material, and prior to formation of the composite material into a film.

12. The method of claim 9, wherein the inorganic layer is disposed after formation of the composite material into a film.

13. The method of claim 9, wherein the inorganic layer is disposed on the composite material by atomic layer deposition.

14. The method of claim 13, wherein the inorganic layer comprises $AlO_2$.

15. The method of claim 13, wherein the inorganic layer comprises $SiO_2$.

16. The method of claim 1, wherein the composite material has an optical density of about 0.5 to about 0.9 at the blue LED wavelength and a path length of about 50 micron to about 200 micron.

17. The method of claim 1, wherein the luminescent nanocrystals dispersed in the composite material absorb blue light and emit green light and red light.

18. The method of claim 1, wherein the first polymeric material comprises aminosilicone.

19. The method of claim 1, wherein the first polymeric material comprises one or more of poly(vinyl butyral):poly (vinyl acetate); epoxies; urethanes; silicone and derivatives of silicone, including polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including methylmethacrylate, butylmethacrylate, and laurylmethacrylate; styrene based polymers; and polymers that are crosslinked with difunctional monomers including divinylbenzene.

20. The method of claim 18 or 19, wherein the second polymeric material comprises an epoxy or polycarbonate.

21. The method of claim 1, further comprising forming the composite material into a film.

22. The method of claim 1, comprising adding a crosslinker to the mixture prior to the curing in (b).

23. The method of claim 22, wherein the first polymeric material comprises crosslinked aminosilicone.

24. A method of preparing a luminescent nanocrystal composite material, the method comprising:
    (a) dispersing a plurality of luminescent nanocrystals in a first polymeric material to form a mixture of the luminescent nanocrystals and the first polymeric material;
    (b) curing the mixture;
    (c) generating a particulate from the cured mixture;
    (d) dispersing the particulate in a second polymeric material to generate the composite material; and
    (e) disposing an inorganic layer on the composite material.

25. The method of claim 24, wherein the inorganic layer is disposed after formation of the composite material.

26. The method of claim 24, wherein the inorganic layer is disposed after formation of the composite material, and prior to formation of the composite material into a film.

27. The method of claim 24, wherein the inorganic layer is disposed after formation of the composite material into a film.

28. The method of claim 24, wherein the inorganic layer is disposed on the composite material by atomic layer deposition.

29. The method of claim 28, wherein the inorganic layer comprises $AlO_2$.

30. The method of claim 28, wherein the inorganic layer comprises $SiO_2$.

31. The method of claim 24, further comprising forming the composite material into a film.

32. The method of claim 31, farther comprising optically coupling the film to an LED or a light guide so as to provide the down-conversion of light from the LED.

* * * * *